US010359227B2

(12) United States Patent
Park

(10) Patent No.: US 10,359,227 B2
(45) Date of Patent: Jul. 23, 2019

(54) REFRIGERATOR AND METHOD FOR CONTROLLING THE SAME

(71) Applicant: LG ELECTRONICS INC., Seoul (KR)

(72) Inventor: Seungje Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/931,776

(22) Filed: Nov. 3, 2015

(65) Prior Publication Data

US 2016/0131420 A1 May 12, 2016

(30) Foreign Application Priority Data

Nov. 7, 2014 (KR) .................. 10-2014-0154781

(51) Int. Cl.
*F25D 29/00* (2006.01)
*F25D 23/02* (2006.01)
(Continued)

(52) U.S. Cl.
CPC .......... *F25D 29/005* (2013.01); *F25D 23/02* (2013.01); *F25D 23/028* (2013.01); *F25D 29/006* (2013.01); *G06F 3/0412* (2013.01); *G06F 3/0416* (2013.01); *G06F 3/0488* (2013.01); *H03K 17/962* (2013.01); *F25D 2201/126* (2013.01); *F25D 2400/361* (2013.01); *G06F 3/045* (2013.01); *G06F 3/0414* (2013.01); *H03K 2217/94031* (2013.01); *H03K 2217/96079* (2013.01); *H03K 2217/960705* (2013.01); *H03K 2217/960785* (2013.01)

(58) Field of Classification Search
CPC .... F25D 29/005; F25D 29/006; F25D 23/028; F25D 23/02; F25D 2201/126; G06F 3/0412; G06F 3/0488; G06F 3/0416; G06F 3/0414; G06F 3/045; H03K 17/962; H03K 2217/960785; H03K 2217/960705; H03K 2217/94031; H03K 2217/96079
See application file for complete search history.

(56) References Cited

U.S. PATENT DOCUMENTS 3,935,485 A    1/1976  Yoshida et al.
4,056,699 A    11/1977  Jordan
(Continued)

FOREIGN PATENT DOCUMENTS

CN    1255665    6/2000
CN    1980061    6/2007
(Continued)

OTHER PUBLICATIONS machine translation of WO201408585.*
(Continued)

*Primary Examiner* — Patrick N Edouard
*Assistant Examiner* — Joseph P Fox
(74) *Attorney, Agent, or Firm* — Ked & Associates, LLP

(57) ABSTRACT

According to an embodiment for a refrigerator, a plurality of touch parts may be manipulated to enter into a special mode, thereby preventing the refrigerator from malfunctioning. The touch sensitivity adjustment of the refrigerator due to the touch manipulation of the refrigerator may be visualized.

11 Claims, 29 Drawing Sheets

(51) Int. Cl.
*G06F 3/041* (2006.01)
*H03K 17/96* (2006.01)
*G06F 3/0488* (2013.01)
*G06F 3/045* (2006.01)

(56) References Cited

U.S. PATENT DOCUMENTS

| | | | |
|---|---|---|---|
| 5,239,152 A | 8/1993 | Caldwell et al. | |
| 5,780,530 A | 7/1998 | Mizutani et al. | |
| 5,923,522 A | 7/1999 | Sajna | |
| 5,973,420 A | 10/1999 | Kaiserman et al. | |
| 5,995,877 A | 11/1999 | Brueggemann et al. | |
| 6,242,076 B1 | 6/2001 | Andriash | |
| 6,265,682 B1 | 7/2001 | Lee | |
| 6,663,111 B1 | 12/2003 | Freiseisen et al. | |
| 6,667,563 B2 | 12/2003 | Bae et al. | |
| 7,155,317 B1* | 12/2006 | Tran | H05B 37/0227 307/117 |
| 7,573,701 B2 | 8/2009 | Doberstein et al. | |
| 7,869,589 B2 | 1/2011 | Tuovinen | |
| 7,911,321 B2 | 3/2011 | Bingle et al. | |
| 8,320,131 B2 | 11/2012 | Paleczny et al. | |
| 8,371,551 B2 | 2/2013 | Jang | |
| 8,384,679 B2 | 2/2013 | Paleczny et al. | |
| 8,648,832 B2 | 2/2014 | Maloof et al. | |
| 8,742,647 B2 | 6/2014 | Fluhrer | |
| 8,922,979 B2 | 12/2014 | Fluhrer | |
| 9,323,289 B2* | 4/2016 | Oohira | G06F 1/1643 |
| 9,448,628 B2 | 9/2016 | Tan et al. | |
| 10,007,385 B2 | 6/2018 | Kim et al. | |
| 2002/0066971 A1* | 6/2002 | Takashi | B29C 45/844 264/40.1 |
| 2003/0043449 A1 | 3/2003 | Takeuchi et al. | |
| 2004/0100479 A1* | 5/2004 | Nakano | G06F 1/1626 715/700 |
| 2006/0177212 A1 | 8/2006 | Lamborghini et al. | |
| 2006/0262549 A1 | 11/2006 | Schmidt et al. | |
| 2007/0051610 A1 | 3/2007 | Weiss | |
| 2007/0130965 A1* | 6/2007 | Boarman | F25D 23/126 62/135 |
| 2007/0246267 A1* | 10/2007 | Koottungal | H03K 17/975 178/18.06 |
| 2008/0143684 A1* | 6/2008 | Seo | G06F 3/04883 345/173 |
| 2008/0165154 A1* | 7/2008 | Kim | G06F 3/0488 345/173 |
| 2008/0196945 A1* | 8/2008 | Konstas | G06F 3/03547 178/18.03 |
| 2008/0202912 A1 | 8/2008 | Boddie et al. | |
| 2008/0257706 A1 | 10/2008 | Haag | |
| 2009/0090605 A1 | 4/2009 | Arione et al. | |
| 2009/0107829 A1 | 4/2009 | Heimann | |
| 2009/0128375 A1 | 5/2009 | Heimann et al. | |
| 2009/0306827 A1 | 12/2009 | Kim et al. | |
| 2009/0322700 A1 | 12/2009 | D'Souza et al. | |
| 2010/0007531 A1 | 1/2010 | Fluhrer | |
| 2010/0045617 A1 | 2/2010 | Lee | |
| 2010/0114011 A1* | 5/2010 | Herrmann | A61M 5/16854 604/25 |
| 2010/0149000 A1 | 6/2010 | Heimann | |
| 2010/0216929 A1 | 8/2010 | Jung et al. | |
| 2010/0219176 A1 | 9/2010 | Striegler | |
| 2011/0032199 A1 | 2/2011 | Seo et al. | |
| 2011/0048047 A1 | 3/2011 | Kim | |
| 2011/0134627 A1 | 6/2011 | Hamlin et al. | |
| 2011/0175845 A1 | 7/2011 | Honda et al. | |
| 2011/0242028 A1 | 10/2011 | Lee et al. | |
| 2011/0267304 A1* | 11/2011 | Simmons | G06F 3/0416 345/174 |
| 2011/0299129 A1 | 12/2011 | Ishida et al. | |
| 2012/0063108 A1 | 3/2012 | Kim et al. | |
| 2012/0138336 A1 | 6/2012 | Watanabe et al. | |
| 2012/0138337 A1 | 6/2012 | Kim | |
| 2012/0274602 A1 | 11/2012 | Bita et al. | |
| 2013/0021274 A1* | 1/2013 | Fukushima | H03K 17/9622 345/173 |
| 2013/0067940 A1* | 3/2013 | Shim | F25B 49/005 62/125 |
| 2013/0082948 A1* | 4/2013 | Ok | F25D 29/00 345/173 |
| 2013/0126325 A1 | 5/2013 | Curtis et al. | |
| 2013/0147751 A1 | 6/2013 | Alaman Aguilar et al. | |
| 2013/0229359 A1 | 9/2013 | Wang et al. | |
| 2014/0101589 A1* | 4/2014 | Hyun | F25D 29/00 715/769 |
| 2014/0184577 A1 | 7/2014 | Kim et al. | |
| 2014/0203863 A1* | 7/2014 | Gillespie | H03K 17/9622 327/517 |
| 2014/0300263 A1 | 10/2014 | Sung et al. | |
| 2015/0002451 A1 | 1/2015 | Um | |
| 2015/0192352 A1* | 7/2015 | Sung | F25D 23/028 62/125 |
| 2015/0276302 A1* | 10/2015 | Roh | G02F 1/133377 62/56 |
| 2015/0378514 A1 | 12/2015 | Keski-Jaskari | |
| 2016/0003519 A1 | 1/2016 | Kim et al. | |
| 2016/0105985 A1 | 4/2016 | Wang et al. | |
| 2016/0117022 A1 | 4/2016 | Kim et al. | |
| 2016/0178277 A1 | 6/2016 | Park | |
| 2017/0089633 A1 | 3/2017 | Kim et al. | |

FOREIGN PATENT DOCUMENTS

| | | |
|---|---|---|
| CN | 101535748 | 9/2009 |
| CN | 101738051 | 6/2010 |
| CN | 101741371 A | 6/2010 |
| CN | 101939605 | 1/2011 |
| CN | 102338544 | 2/2012 |
| CN | 202582565 | 12/2012 |
| CN | 103105979 | 5/2013 |
| CN | 103109135 | 5/2013 |
| CN | 105546930 | 5/2016 |
| CN | 105577156 | 5/2016 |
| DE | 297 22 565 U1 | 2/1998 |
| DE | 10 2009 001 412 A1 | 9/2010 |
| EP | 2770638 | 8/2014 |
| EP | 2 789 943 | 10/2014 |
| EP | 2 975 345 A1 | 1/2016 |
| EP | 3007361 | 4/2016 |
| JP | S 58-14433 | 1/1983 |
| JP | H 06-095803 A | 4/1994 |
| JP | H 06-060031 | 8/1994 |
| JP | 2006-250485 A | 9/2006 |
| JP | 2007-100995 | 4/2007 |
| JP | 2010-230226 | 10/2010 |
| JP | 2011-090897 | 5/2011 |
| JP | 2012-098828 | 5/2012 |
| JP | 2013-057432 | 3/2013 |
| JP | 2013-072581 | 4/2013 |
| JP | 2013-5309398 A | 7/2013 |
| JP | 2013-181734 | 9/2013 |
| JP | 2014-031958 | 2/2014 |
| JP | 2014-031978 A | 2/2014 |
| JP | 2014-040939 A | 3/2014 |
| JP | 2014-055700 | 3/2014 |
| JP | 2014-085024 | 5/2014 |
| JP | 2014137147 | 7/2014 |
| JP | 2014-196933 | 10/2014 |
| KR | 10-2000-0031593 | 6/2000 |
| KR | 10-0578400 B1 | 5/2006 |
| KR | 10-2006-0095696 A | 9/2006 |
| KR | 10-0634365 B1 | 10/2006 |
| KR | 10-0663866 B1 | 1/2007 |
| KR | 10-0756451 | 9/2007 |
| KR | 10-2008-0045044 A | 5/2008 |
| KR | 10-0866342 | 10/2008 |
| KR | 10-2009-0090518 A | 8/2009 |
| KR | 10-2010-0050190 A | 5/2010 |
| KR | 10-2010-0074034 | 7/2010 |
| KR | 10-2010-0095274 | 8/2010 |
| KR | 10-2011-0009438 | 1/2011 |
| KR | 10-1132463 | 3/2012 |

(56) References Cited

FOREIGN PATENT DOCUMENTS

| KR | 10-2012-0048655 |  | 5/2012 |
|---|---|---|---|
| KR | 10-2012-0050070 | A | 5/2012 |
| KR | 10-2012-0116207 |  | 10/2012 |
| KR | 10-1237564 |  | 2/2013 |
| KR | 10-2013-0040058 |  | 4/2013 |
| KR | 10-2014-0121753 | A | 10/2014 |
| WO | WO 2008/069352 | A1 | 6/2005 |
| WO | WO 2007/105950 |  | 9/2007 |
| WO | WO 2008/069352 |  | 6/2008 |
| WO | WO 2009/104859 |  | 8/2009 |
| WO | WO 2010-015749 |  | 2/2010 |
| WO | WO 2011/081279 |  | 7/2011 |
| WO | WO 2014/034434 |  | 3/2014 |
| WO | WO 2014/168391 |  | 10/2014 |
| WO | WO 2014/208585 | A1 | 12/2014 |
| WO | WO 2015-128990 |  | 9/2015 |
| WO | WO 2016/072802 |  | 5/2016 |

OTHER PUBLICATIONS

Korean Notice of Allowance dated Sep. 30, 2016 issued in Application No. 10-2014-0188229.
Australian Office Action dated Aug. 22, 2016 issued in Application No. 2016201233.
European Search Report dated Sep. 19, 2016 issued in Application No. 16161569.5.
European Search Report dated May 3, 2016 issued in Application No. 15201832.1.
European Search Report dated Apr. 25, 2016 issued in Application No. 15200775.3.
European Search Report dated Jun. 15, 2016 issued in Application No. 15201840.4.
European Search Report dated May 31, 2016 issued in Application No. 15191174.0.
European Search Report dated Mar. 22, 2016 issued in Application No. 15192563.3.
European Search Report dated May 13, 2016 issued in Application No. 15201205.0.
Korean Notice of Allowance dated Jun. 28, 2016 issued in Application No. 10-2015-0063758 (with English Translation).
U.S. Office Action dated Feb. 8, 2017 issued in co-pending U.S. Appl. No. 15/060,974.
U.S. Notice of Allowance dated Apr. 12, 2017 issued in co-pending U.S. Appl. No. 15/060,974.
U.S. Office Action dated May 19, 2017 issued in U.S. Appl. No. 14/977,623.
Chinese Office Action dated Jul. 3, 2017 issued in Application No. 201510671495.5 (with English translation).
Chinese Office Action dated Jul. 3, 2017 issued in Application No. 201510684487.4 (with English translation).
U.S. Ex Parte Quayle Action dated Sep. 28, 2017 issued in co-pending U.S. Appl. No. 14/977,623.
Chinese Office Action dated Oct. 25, 2017 issued in Application No. 201510977666.7 (with English translation).
Chinese Office Action dated Sep. 29, 2017 issued in Application No. 201510977160.6 (with English translation).
United States Office Action dated Oct. 5, 2017 issued in U.S. Appl. No. 14/921,681.
U.S. Office Action dated Oct. 5, 2017 issued in co-pending U.S. Appl. No. 14/977,615.
U.S. Office Action dated Nov. 17, 2017 issued in co-pending U.S. Appl. No. 14/977,605.
U.S. Appl. No. 15/060,974, filed Mar. 4, 2016, Liliana P. Cerullo, U.S. Pat. No. 9,739,527, dated Aug. 22, 2017.
U.S. Appl. No. 14/977,623, filed Dec. 21, 2015, Suezu Y. Ellis, U.S. Pat. No. 10,006,625, dated Jun. 26, 2018.
U.S. Appl. No. 14/921,681, filed Oct. 23, 2015, Chayce R. Bibbee, U.S. Pat. No. 10,007,385, dated Jun. 26, 2018.
U.S. Appl. No. 14/977,572, filed Dec. 21, 2015, Vanessa Mary Girardi.
U.S. Appl. No. 14/977,588, filed Dec. 21, 2015, Hang Lin.
U.S. Appl. No. 14/977,605, filed Dec. 21, 2015, Benyam Ketema.
U.S. Appl. No. 14/977,615, filed Dec. 21, 2015, Chayce R. Bibbee.
U.S. Appl. No. 15/305,261, filed Oct. 19, 2016, Ryan A. Lubit.
U.S. Appl. No. 15/358,226, filed Nov. 22, 2016, Naomi M. Wolford.
U.S. Appl. No. 15/952,550, filed Apr. 13, 2018, Chayce R. Bibbee.
United States Office Action dated Jul. 25, 2018 issued in U.S. Appl. No. 14/977,588.
U.S. Appl. No. 14/921,681, filed Oct. 23, 2015, Chayce R. Bibbee.
U.S. Appl. No. 14/977,623, filed Dec. 21, 2015, Suezu Y. Ellis.
U.S. Appl. No. 15/952,941, filed Apr. 13, 2018, Suezu Y. Ellis.
U.S. Office Action dated May 25, 2018 issued in co-pending U.S. Appl. No. 14/977,605.
United States Ex Parte Quayle Office Action dated Feb. 28, 2018 issued in U.S. Appl. No. 14/977,572.
International Search Report dated Mar. 2, 2016 issued in Application No. PCT/KR2015/011956 (full English text).
United States Office Action dated Apr. 24, 2018 issued in U.S. Appl. No. 15/305,261.
European Search Report dated Jun. 20, 2018.
European Search Report dated Jun. 19, 2018.
Chinese Office Action dated Jul. 27, 2018 (English Translation).
U.S. Notice of Allowance Issued in U.S. Appl. No. 14/977,605 dated Aug. 29, 2018.
U.S Office Action Issued in U.S. Appl. No. 15/952,941 dated Aug. 30, 2018.
U.S. Office Action dated Feb. 5, 2019 issued in U.S. Appl. No. 14/977,588.
European Office Action dated Sep. 18, 2018 issued in EP Application No. 15 191 174.0.
United States Office Action dated Jan. 11, 2019 issued in co-pending related U.S. Appl. No. 16/199,992.
United States Office Action dated Apr. 23, 2019 issued in co-pending related U.S. Appl. No. 15/358,226.

* cited by examiner

REFRIGERATOR AND METHOD FOR CONTROLLING THE SAME

CROSS-REFERENCE TO RELATED APPLICATION

The present application claims priority under 35 U.S.C. § 119 and 35 U.S.C. § 365 to Korean Patent Application No. 10-2014-0154781 filed on Nov. 7, 2014, whose entire disclosure is hereby incorporated by reference.

BACKGROUND

1. Field

The present disclosure relates to a refrigerator and a method for controlling the same.

2. Background

In general, a touch sensor assembly that is used for home appliances recognizes a pushing operation of a user to generate a signal for operating a home appliance. The touch sensor assembly includes a capacitive sensor and a resistance cell type sensor. The sensors may detect touch of the user to convert the user's touch into a signal for operating the home appliance.

In the recent home appliances, exterior members of the home appliances may be formed of steel or glass or coated with a material similar to the steel or glass to improve outer appearances of the home appliances. A touch sensor assembly for recognizing touch of the exterior members when the exterior members are touched is being also developed.

Refrigerators are home appliances for storing foods at a low temperature in a storage space that is covered by a door. The refrigerator cools the inside of the storage space using cool air generated by heat-exchanging with a refrigerant that circulates a cooling cycle to store the foods in an optimum state.

The inside of the refrigerator may be classified into a refrigerating compartment and a freezing compartment. Accommodation members such as shelves, drawers, and baskets may be disposed within the refrigerating compartment and the freezing compartment. Also, each of the refrigerating compartment and the freezing compartment may be closed by a door. The refrigerator is classified into various types according to positions of the refrigerator compartment and the freezer compartment and configurations of the doors.

Recently, as the tendency of high-quality and multifunctional refrigerator increases, refrigerators having improved outer appearances and various equipment for convenience are introduced. For example, refrigerators in which an external member that defines an outer appearance is formed of steel or glass or coated with a material similar to the steel or glass, and displays and manipulation devices having various structures are adopted are being developed. A refrigerator according to the related art is disclosed in Korean Patent Registration No. 10-0634365.

It is necessary to enter into a special mode that is not a general manipulation mode so as to inspect a product in a production line after the refrigerator is completely assembled or check or manage the refrigerator when a service situation occurs during the use by a user. The special mode may have an influence on an operation of the refrigerator. To prevent manipulation due to user's carelessness from occurring, a manipulation part may not have a general manipulation shape, but have a shape in which a plurality of buttons have to be pushed at the same time. Alternatively, a button through which separate reset or special mode entry is enabled may be provided at a position except for the position at which the manipulation part is disposed.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
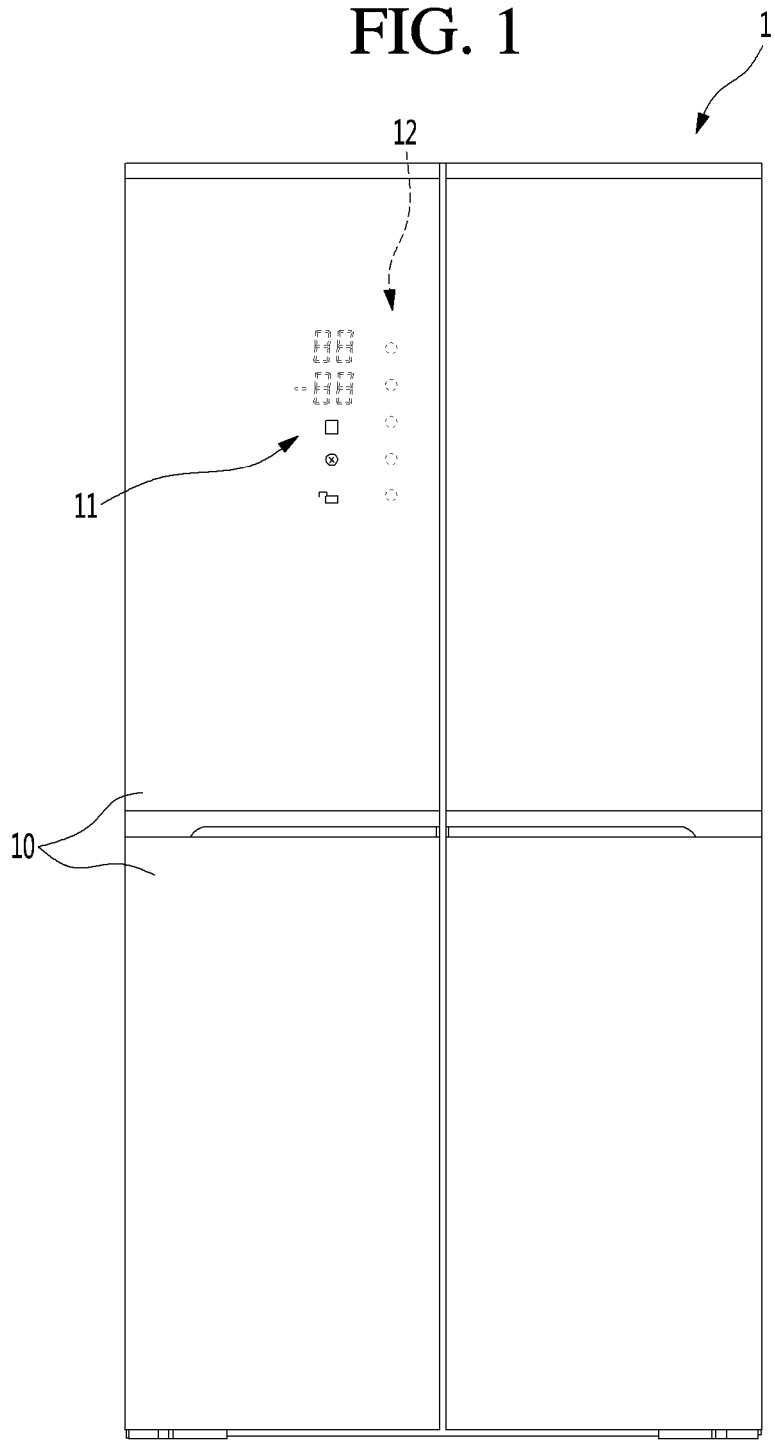
FIG. 1 is a front view of a refrigerator according to an embodiment.
Figure 2:
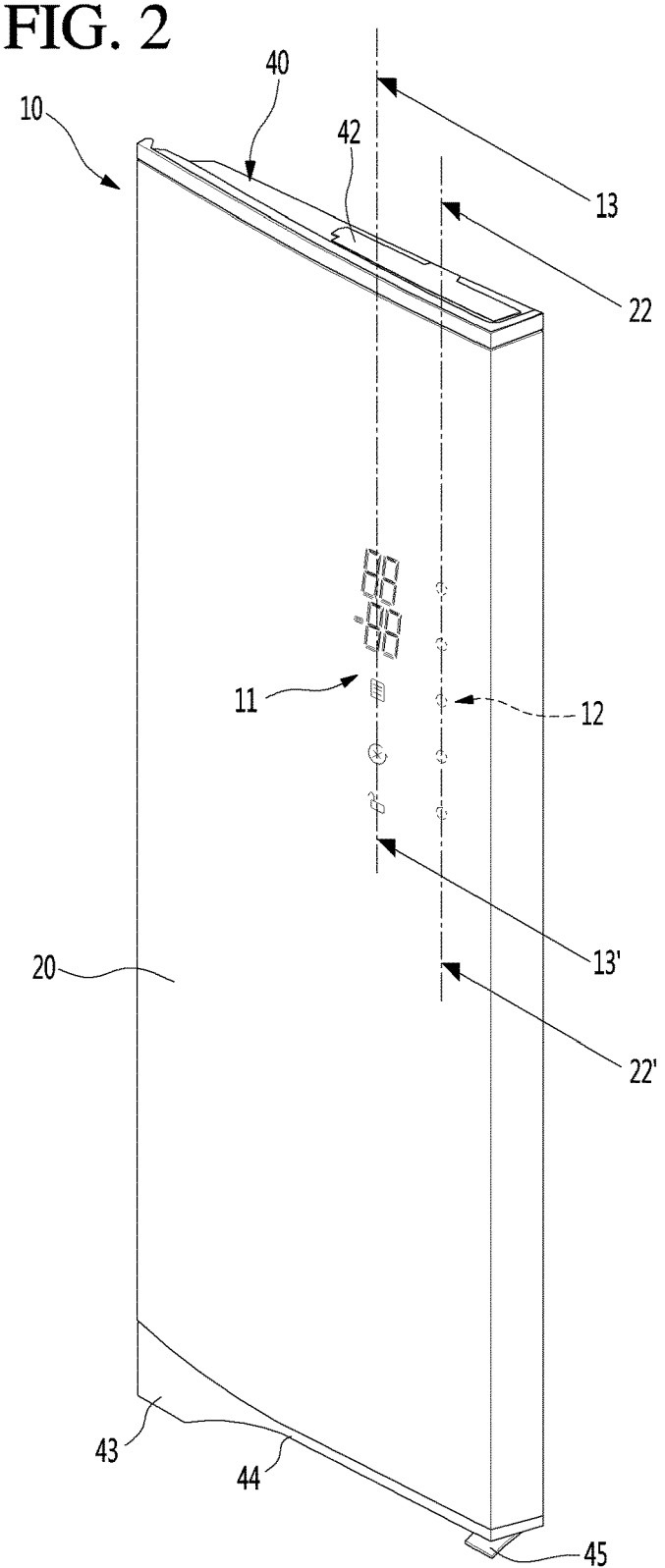
FIG. 2 is a perspective view of the refrigerator door according to an embodiment.

FIG. 1 is a front view of a refrigerator according to an embodiment. A refrigerator 1 according to an embodiment includes a cabinet defining a storage space and a refrigerator door 10 mounted on the cabinet to open or close the storage space. An outer appearance of the refrigerator 1 may be defined by the cabinet and the refrigerator door 10.

The storage space may be partitioned into both left/right sides or vertically partitioned. A plurality of refrigerator doors 10 for opening/closing the spaces may be disposed on the opened spaces of the storage space. Each of the refrigerator doors 10 may open and close the storage space in a sliding or rotating manner. When the refrigerator door 10 is closed, the refrigerator door 10 may define a front outer appearance of the refrigerator 1.

A display window or a display area 11 and a manipulation part or user interface may be disposed on one refrigerator door 10 of the plurality of refrigerator doors 10 at a height at which user's manipulation and distinguishment are easy. The display window 11 may be configured to appear an operation state of the refrigerator 1 to the outside. A symbol or figure may be expressed while light is irradiated into the refrigerator door 10 to allow a user to identify the symbol or figure. The display window 11 may be commonly defined as a hole through which light is transmittable or a transparent portion.

The manipulation part may be a portion that is constituted by a plurality of touch parts for performing touching manipulation to operate the refrigerator 1. The touch manipulation part or touch user interface 12 may be disposed on a portion of a front surface of the refrigerator door 10. A portion at which the pushing manipulation is capable of being detected may be defined by surface processing such as printing or etching or various light transmission methods.

As illustrated in FIGS. 2 to 5, the refrigerator door 10 includes a front panel 20 defining a front outer appearance thereof, deco members 40 and 43 that are respectively disposed on upper and lower ends of the front panel 20, and a door liner 30 defining a rear outer appearance thereof. An overall outer appearance of the refrigerator door may be defined by the front panel 20, the deco members 40 and 43, and the door liner 30.

The front panel 20 may define the front outer appearance of the refrigerator door 10 and be formed of a stainless steel material having a plate shape. The front panel 20 may constitute at least a portion of the outer appearance of the refrigerator door 10. The front panel 20 may be applied to an exterior member in other home appliances.

The front panel 20 may be formed of metal or a material having the same texture as the metal. The front panel 20 may be formed of a glass or plastic material. The front panel 20 may define a portion of a side surface of the refrigerator door 10 as well as the front surface of the refrigerator door 10. Fingerprint prevention processing or hairline processing may be further performed on a surface of the front panel 20.

The display window 11 may be defined by a plurality of first through holes or light transmitting material or surface 21 provided in a portion of the front panel 20. The display window 11 may be constituted by a numerical display part or interface 11a for display figures and a set of the plurality of first through holes 21 in which a symbol display parts or interface 11b for displaying symbols, charters, or pictures are punched at a predetermined distance.

As illustrated in the drawings, the numerical display part 11a may be disposed in the form of seven segments that is a set of the plurality of first through holes 21. The numerical display part 11a may be disposed on each of upper and lower portion to independently display temperatures of the refrigerating compartment and the freezing compartment. Alternatively, the numerical display part 11a may display various information that are capable of being displayed by using figures in addition to the temperature information. The numerical display part 11a may selectively display the various information through the manipulation of the manipulation part or the user interface.

The symbol display parts 11b are disposed under the numerical display part 11a. The symbol display parts 11b may display an operation state of the refrigerator 1 by using a symbol or picture. The set of the first through holes 21 may be disposed in a shape corresponding to the symbol display parts 11b to allow the user to intuitionally see the operation state of the refrigerator 1.

Figure 3:
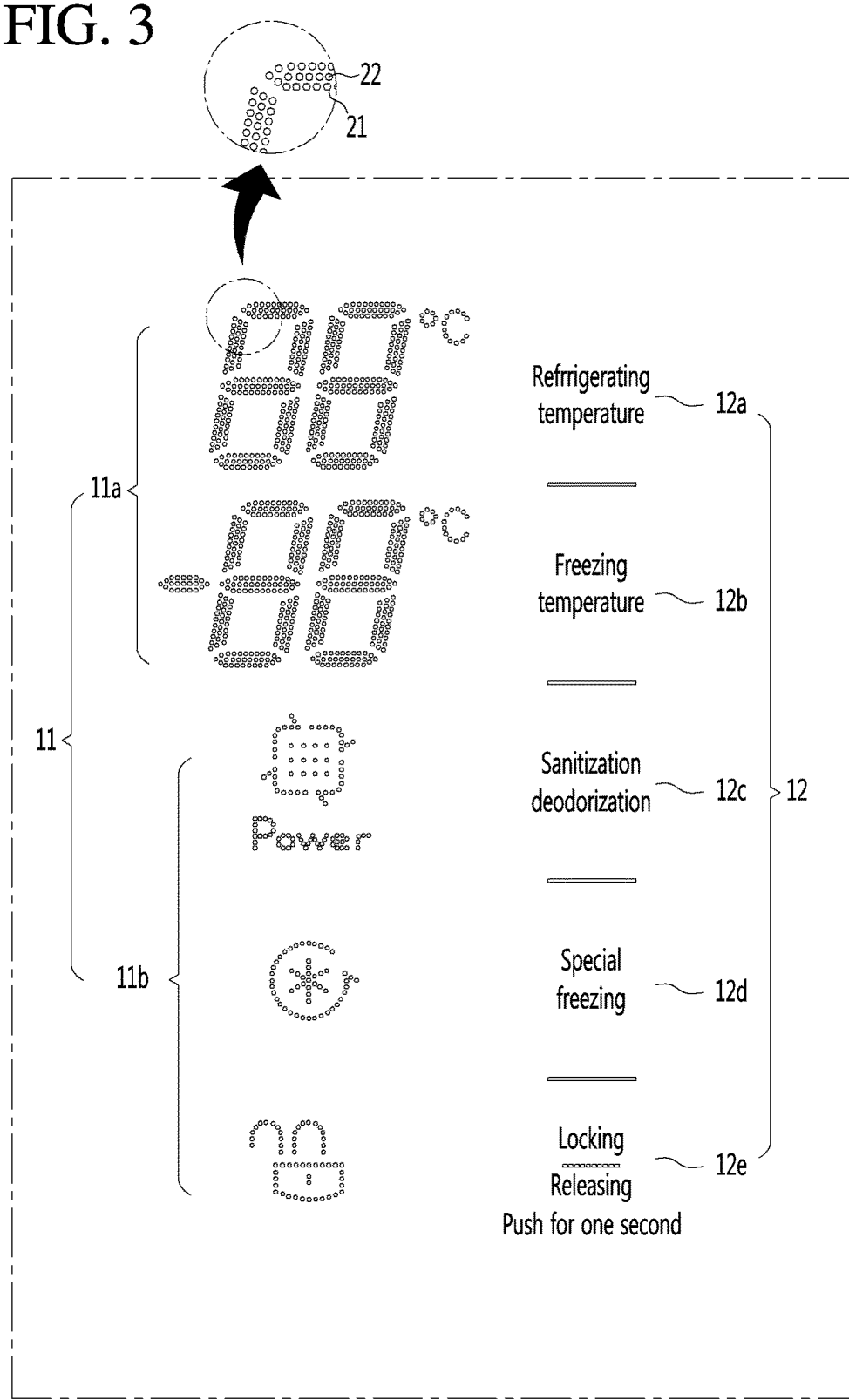
FIG. 3 is a view illustrating a display window and manipulation part of the refrigerator door.
Figure 4:
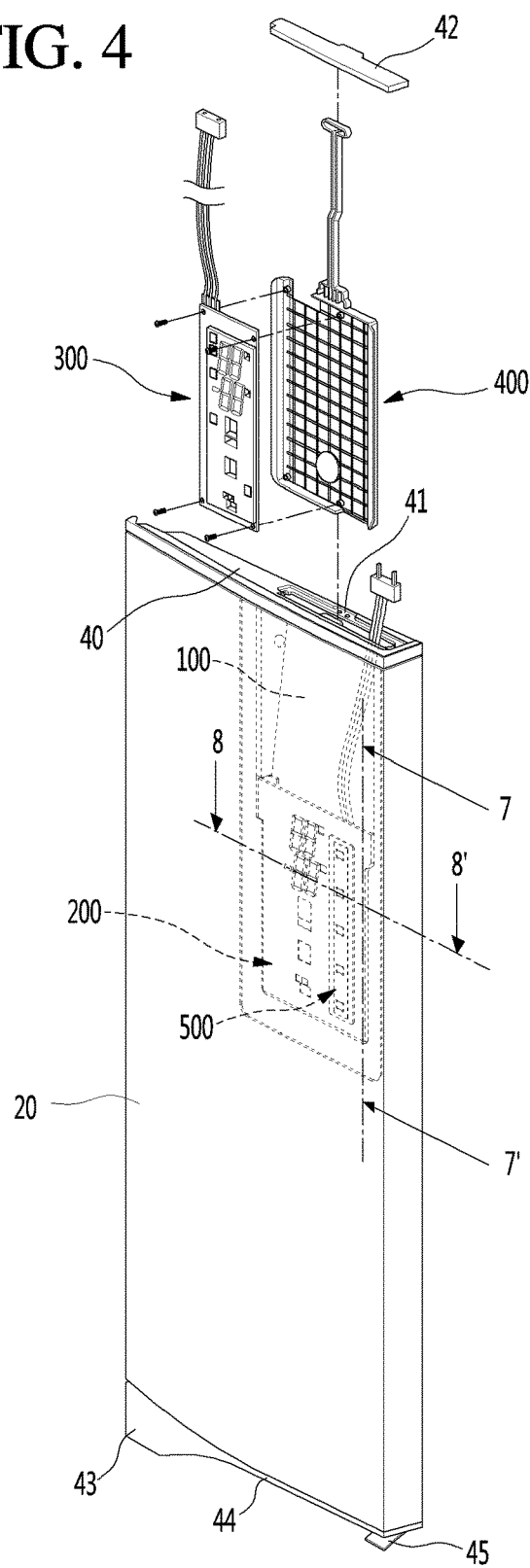
FIG. 4 is an exploded perspective view illustrating a mounted structure of a display assembly of the refrigerator door.

For example, a symbol, which is disposed at the lowermost position, of the symbol display parts 11b of FIG. 3 may be expressed in a lock shape to indicate a locked state. A symbol that is disposed at an intermediate position may be expressed in a filter shape to indicate a sanitization or deodorization operation. Alternatively, the symbol display part 11b may have various shapes and be provided in various numbers.

The display window 11 may be defined to correspond to second and third through holes 220 and 321 which will be described later so that light emitted from an LED 313 of a display assembly 300 is transmitted therethrough. The first through hole 21 may be formed with a fine size through laser processing or etching. The first through hole 21 may be formed with a size at which it is difficult to easily identify the operation state of the refrigerator when light is not transmitted.

Although the numerical display part 11a and the symbol display part 11b are not clearly illustrated in FIG. 3 so as to allow the numerical display part 11a and the symbol display part 11b to be expressed as the form that is constituted by the plurality of first through holes 21, if the LED 313 is turned off in a state where the first through holes 21 are spaced a predetermined distance from each other, it may be difficult to distinguish the numerical display part 11a and the symbol display part 11b because each of the first through holes has a fine size.

In case of the numerical display part 11a, only a portion onto which light is irradiated according to operations of the seven segments of the light source may be transmitted through the first through holes 21 to display figures on the front panel 20. On the other hand, a portion onto which the light is not irradiated may not be well distinguished. In case of the symbol display part 11b, if the corresponding LED is turned on when the corresponding function is performed, light may be irradiated to allow the symbol display part 11b to be distinguished. On the other hand, if the LED is turned off, the symbol display part 11b may not be well distinguished.

As described above, the fine or minute holes 21 of the numerical display part 11a and the symbol display part 11b for the display window 11 may not be visible when light is turned off. Thus, other components may not be disposed on the front surface of the refrigerator door 10, and the entire front surface of the refrigerator door 10 may be expressed as if a metal plate by using the front panel 20 to realize the simple and elegant outer appearance of the front surface of the refrigerator door 10.

A sealing member 22 may be filled into the first through hole 21. The sealing member 22 may prevent the first through hole 21 from being blocked by foreign substances. The sealing member 22 may be formed of a silicon or epoxy material so that the first through hole 21 is blocked, but the light is transmitted. The inside of the first through hole 21 may be filled with the sealing member 22 to prevent a processed surface of the first through hole 21 from being corroded.

The sealing member 22 may be filled into the first though hole 21 through a separate process. The sealing member 22 may be filled into the first through hole 21 while a coating process is performed on the surface of the front panel 20, or the sealing member 22 may be attached in the form of a sheet to block the plurality of first through holes at the same time. A fingerprint preventing coating and/or a diffusion sheet within the front panel 20 may function as the sealing member 22.

Figure 17:
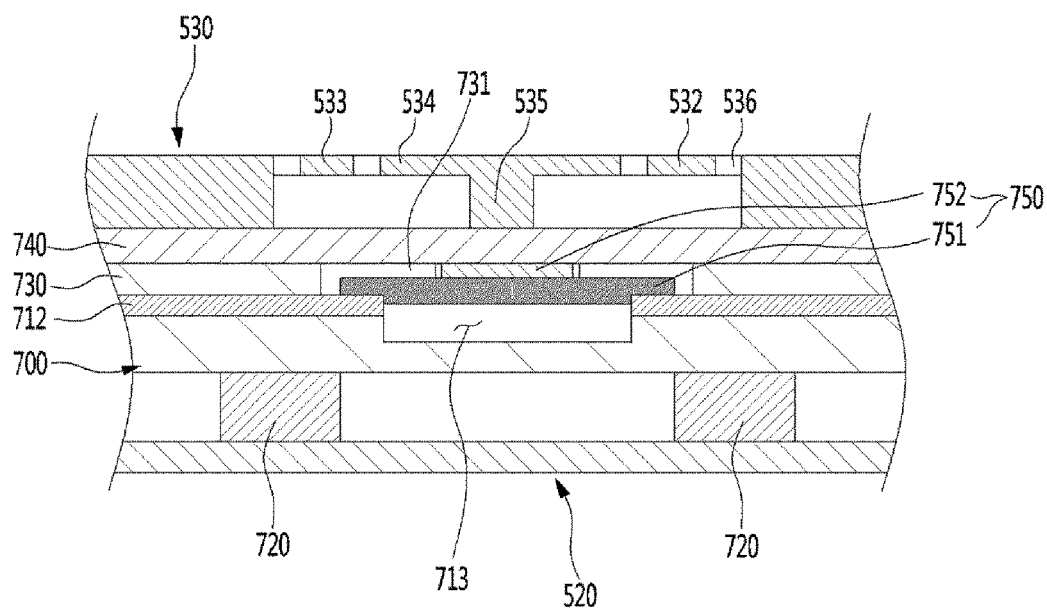
FIG. 17 is a longitudinal cross-sectional view of the touch sensor.
Figure 18:
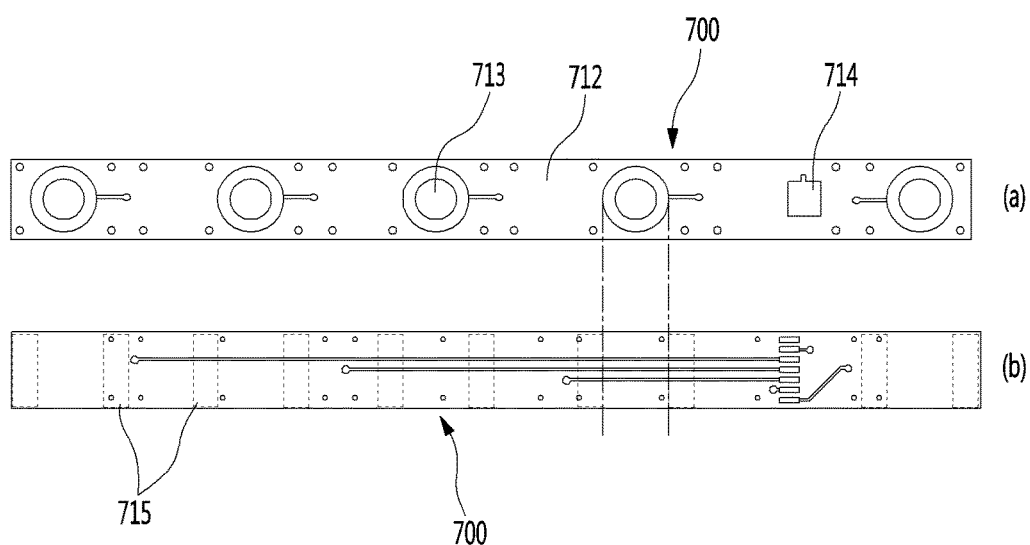
FIG. 18 shows plan and rear views of the sensor PCB that is a main component of the touch sensor assembly.
Figure 19:
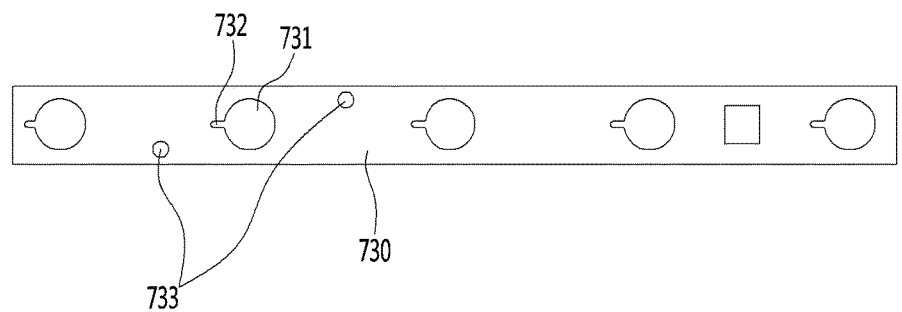
FIG. 19 is a plan view of a spacer that is a main component of the touch sensor assembly.
Figure 20:
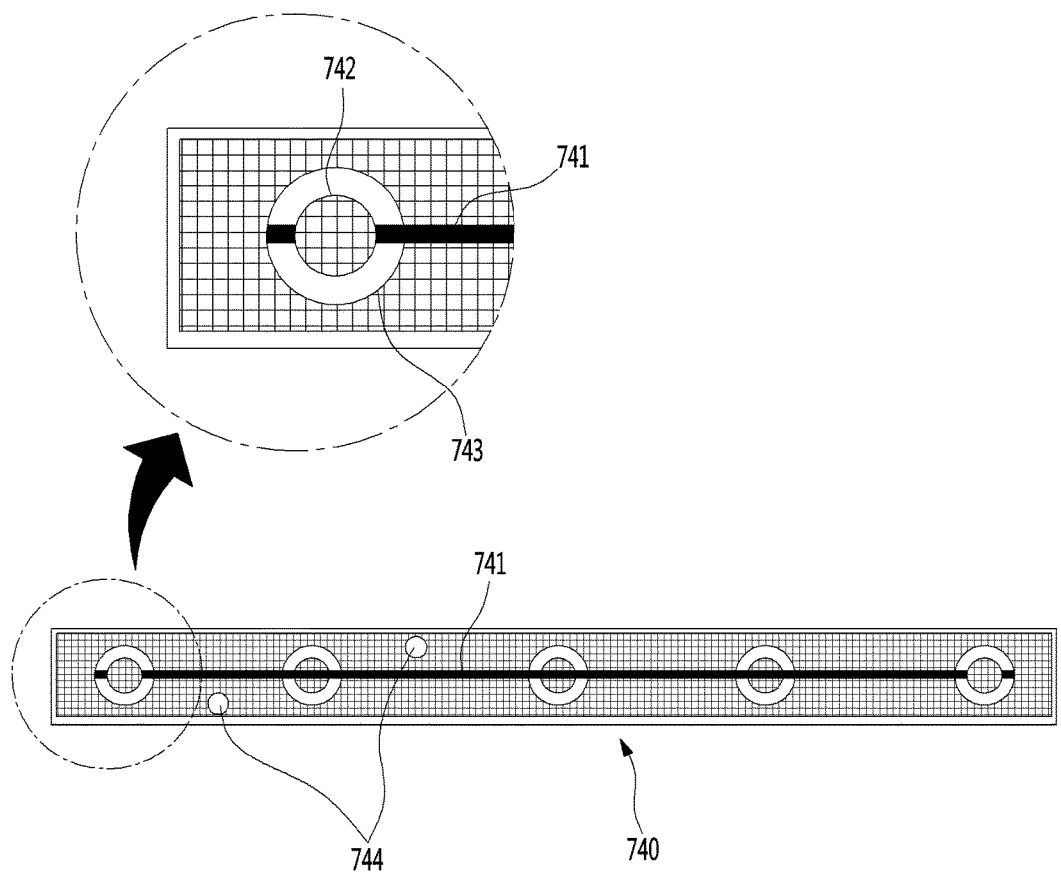
FIG. 20 is a plan view of a conductive foil that is a main component of the touch sensor assembly.

The manipulation part may be a portion that is displayed to allow the user to perform the touch manipulation and be constituted by a plurality of touch parts or input area 12. The touch part 12 may display an area that is detected by the touch sensor assembly 500 when the user touches the area of the touch part. The touch parts 12 may not be physical buttons, but be areas that is displayed on the front surface of the front panel 20. A sensor 750 (see, e.g., FIG. 17) contacting the rear surface of the front panel 20 may be manipulated through the manipulation of the displayed area.

The touch parts 12 may be displayed on the front panel 20 through etching, printing, or other surface processing. Thus, the touch manipulation part 2 may be expressed in a shape that does not stand out when viewed from the outside so that the outer appearance of the front panel 20 is expressed by the whole texture of the front panel 20. The touch parts 12 may be displayed so that the user intuitively understand and manipulate the corresponding function of each of the touch part 12 as the form of the character or symbol. Each of the touch parts 12 may display an area that is recognizable when the user's touch is performed. When the displayed portion of the touch part 12 is pushed, the area may be effectively recognized.

The door liner 30 may have a surface that is coupled to the front panel 20 to face the inside of the storage space. The door liner 30 may be injection-molded using plastic. The door liner 30 may have a structure in which a gasket is disposed or mounted along a circumferential thereof. When the door liner 30 is coupled to the front panel 20, a space may be defined between the door liner 30 and the front panel 20. A foaming solution for forming an insulation material 24 may be filled into the space.

A frame 100 may be attached to a rear surface of the front panel 20. The frame 100 may provide a separate space in which the foaming solution is not filled into the refrigerator door 10 to accommodate the cover display 200, the display assembly 300, the touch sensor assembly 500, and a display frame 400.

The deco members or trims 40 and 43 may define outer appearances of upper and lower portions of the refrigerator door 10. The deco members 40 and 43 may cover the opened upper and lower end of the refrigerator door 10, which are defied by coupling the front panel to the door liner 30, respectively.

An insertion hole 41 and an insertion hole cover 42 for opening/closing the insertion hole 41 may be disposed in/on the upper deco member 40 of the deco members 40 and 43. The insertion hole 41 may pass through the deco member 400 to communicate with the space that is defined by the frame 100. The display assembly 300 may be inserted into the display frame 400, with which the display assembly 300 is assembled, through the insertion hole 41. The insertion hole 41 may have a size in which the display frame 40 is insertable. The insertion hole 41 may be vertically defined with respect to the display cover 200.

Although not shown in detail, a hinge hole to which a rotation shaft of the refrigerator door 10 is hinge-coupled may be defined in one side of the deco member 40. The deco member 40 may have a structure in which a wire guided inside the frame 100 is accessible through the hinge hole and then is connected to a power source part of the cabinet.

A door handle 44 may be disposed on the lower deco member 43 of the refrigerator door 10. The door handle 44 may be recessed in a pocket shape to manipulate the rotation of the refrigerator door 10. A lever 45 for manipulating the opening/closing of the refrigerator door 10 may be further disposed on the lower deco member 43 of the refrigerator door 10. A latch assembly 31 may operate by the manipulation of the lever 45 to selectively maintain the opening or closing of the refrigerator door 10.

Figure 7:
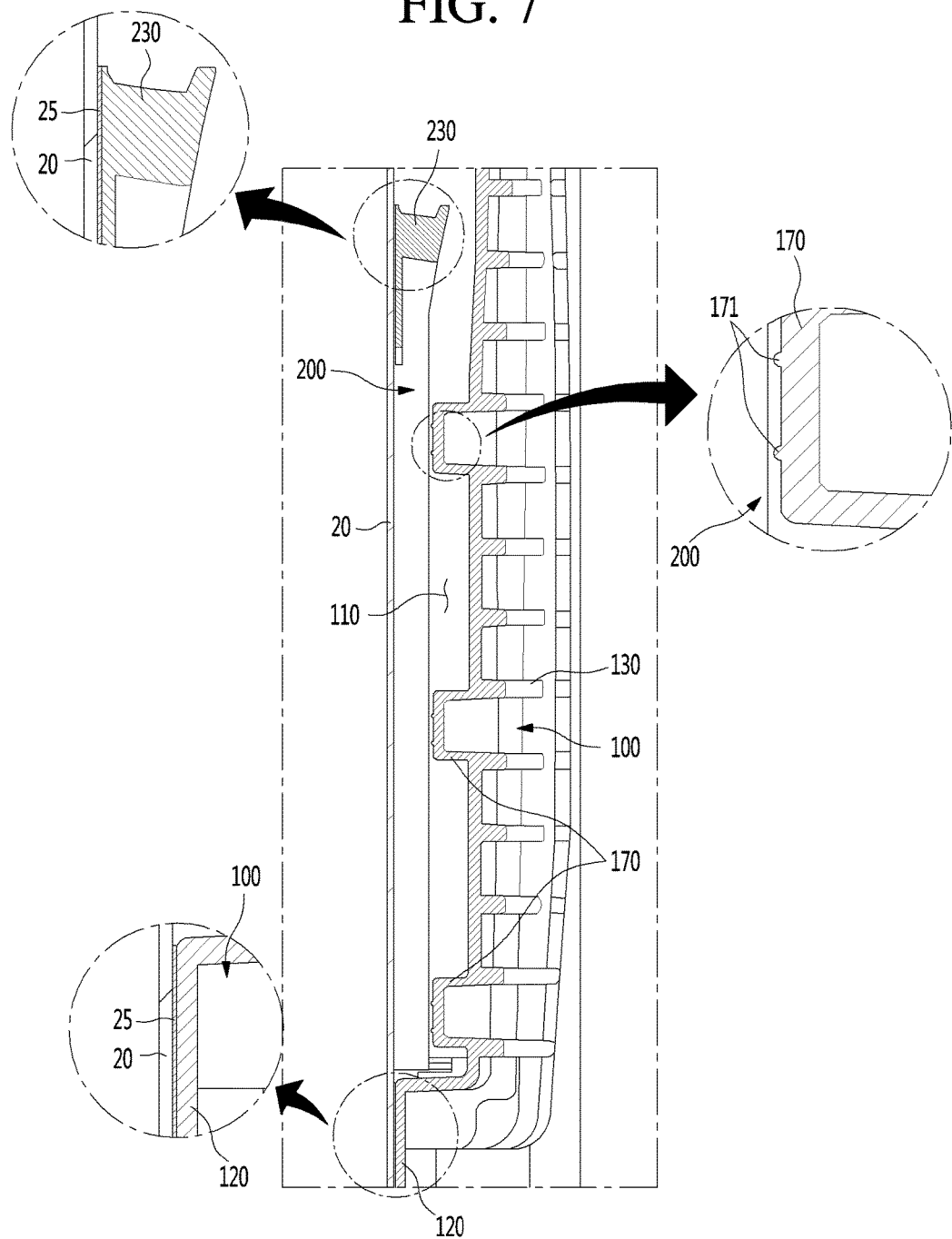
FIG. 7 is a cross-sectional view taken along line 7-7' of FIG. 4.
Figure 8:
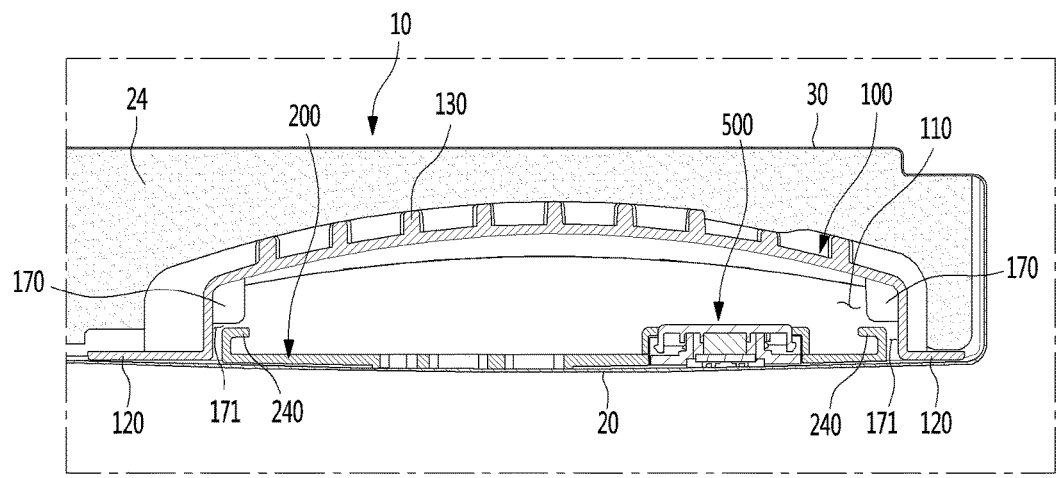
FIG. 8 is a cross-sectional view taken along line 8-8' of FIG. 4.

The display cover 200 is attached to the rear surface of the front panel 20. The display cover 200 may guide the mounting of the display assembly 300 on which the LED 313 (see FIG. 14) is mounted. The display cover 200 may be attached to the rear surface of the front panel 200 by a double-sided tape or an adhesion member 25 (see FIG. 7) that is formed by applying primer thereon.

The touch sensor assembly 500 for detecting user's pushing manipulation on the front panel 20 may be mounted on one side of the display cover 200. The display cover 200 may have a structure in which the cover display 20 is attached to the front panel 20 in a state where the display cover 200 is coupled to the touch sensor assembly 500.

The display cover 200 may be attached to a position at which the display window 11 and the second through hole 220 defined in the cover display 200 match each other. Also, the display cover 200 may be accommodated into the frame 100 in the state where the display cover 200 is attached.

The display assembly 300 is inserted into the space within the frame 100 through the insertion hole 41 in the state where the display assembly 300 is mounted on the display frame 400. When the display frame 400 is completely inserted, the display assembly 300 may be disposed inside the display cover 200, and light emitted from the LED 313 may pass through the display cover 200 and the display window 11 and then be irradiated to the outside.

As illustrated in FIGS. 6 to 9, the front and top surfaces of the frame 100 may be opened. When the frame 100 is attached to the front panel 20, the top surface of the frame 100 may define an opened space 110. A circumference of the frame 100 except for an upper end of the frame 100 may be bent toward the front panel 20, and then, an end of the frame 100 may be bent to the outside to form a frame adhesion part or flange 120. An adhesion member 25 including a double-sided tape or adhesive may be disposed on the frame adhesion part 120. The frame 100 may be attached to the rear surface of the front panel 20.

The frame 100 may have an upper end that contacts the deco member 40 in the state where the frame 100 is attached to the front panel 20. The opened top surface of the frame 100 may communicate with the insertion hole 41 and provide an independent space within the refrigerator door 10. Even though the foaming solution for forming the insulation material 24 is injected into the refrigerator door 10, the foaming solution may not be introduced into the inner space of the frame 100, and thus the frame 100 may be protected.

A plurality of reinforcing ribs may be disposed on the rear surface of the frame 100 to cross each other in length and width directions. Even though the high-pressure foaming solution is filled to form the insulation material 24, the frame may not be deformed due to the reinforcing ribs 130, and the inner space of the frame 100 may be maintained. A plate support 140 on which a support plate 141 is seated is disposed on each of both left/right ends of the upper portion of the frame 100.

The support plate 141 may be disposed in an upper space of the frame 100, which corresponds to an upper side of the display cover 200, in the state where the display cover 200 is mounted on the support plate 141 to support the front panel 20 from a rear side. Thus, rolling of the portion of the frame corresponding to the front panel 20 may be prevented, and also, the deformation of the front panel 20 by an external impact may be prevented.

The plate support 140 may be stepped to support both ends of the support plate 141. The support plate 141 may be slidably inserted into the space between the plate support 140 and the front panel 20 in the state where the frame 100 is attached to the front panel 20. After insertion, a lower edge of the support plate 141 is above a restriction groove 160. In other words, the support plate is provided at the upper region of the frame 100. Alternatively, the support plate 141 may be attached to the rear surface of the front panel 20 when both ends of the plate support 140 are attached to the frame 100 in the fixed state.

A wire entrance hole 150 may be defined in an upper portion of a side surface of the frame 100. The wire entrance hole 150 may provide a passage through which the wire for connecting electronic components to the power source of the cabinet is accessible. The wire entrance hole 150 may be defined in an upper portion of the side surface of the frame 100 that is adjacent to the hinge of the refrigerator door 10 and be defined in a position that is adjacent to a hinge hole of the refrigerator door 10. The frame 100 may be finished to prevent the foaming solution from being introduced into the frame 100 when the foaming solution is injected into the refrigerator door 10.

A restriction groove 160 may be defined in each of both left/right sides of the frame 100. A restriction part or protrusion 230 protruding laterally from each of both left/right ends of the cover display 200 may be inserted into the restriction groove 160. The restriction groove 160 may be receded to the outside and have a shape corresponding to that of the restriction part 230. Thus, the cover display 200 may be maintained in an accurate position without moving.

A cover support 170 for supporting the display cover or plate 200 is disposed on a portion of the frame 100 below the restriction groove to correspond to the display cover 200. The cover support 170 may protrude from each of both left/right surfaces of the frame 100 to push both left/right ends of the display cover 200 from a rear side, thereby supporting the cover display 200.

When the frame 100 is attached to the front panel 20, and the foaming solution is injected into the refrigerator door 10 in the state where the display cover 200 is attached to the rear surface of the front panel 20, the cover support 170 may push the display cover 200 forward to maintain the state in which the display cover 200 is attached to the front panel 20. Even though the adhesion member 25 for attaching the cover display 200 to the front panel 20 is cured to lose its function, the cover support 170 may press the cover display 200 to maintain the state in which the front panel 20 and the cover display 200 are closely attached to each other.

The cover support 170 may be provided in plurality. The plurality of cover supports 170 may be vertically disposed at a uniform distance to uniformly push and support the entire display cover 200. A protrusion 171 protruding forward may be further disposed on a front surface of the cover support 170 that is adjacent to the display cover 200. The protrusion 171 may have a rib or projection shape that is lengthily disposed in a transverse direction to line or point contact the display cover 200. Even though a contact surface between the display cover 200 and the cover support 170 is uneven, the display cover 200 may not be inclined so that the cover support 170 applies a uniform pressure to the display cover 200.

The display cover 200 may be formed of a plastic material having a plate shape. The display cover 200 may be accommodated into the frame 100 in the state where the display cover 200 is attached to the front panel 20. The restriction part 230 protruding outward and inserted into the restriction groove 160 may be disposed on an upper portion of each of both left/right ends of the cover display 200.

An accommodation part or opening 210 on which the touch sensor assembly 500 is mounted may be disposed on the cover display 200. A plurality of second through holes 220 may be defined in a position corresponding to the display window 11 in the cover display 200.

The display assembly 300 may include a display PCB 310 on which the LED 313 is mounted and a reflector 320 disposed on a front surface of the display PCB 310. A sensor control part or sensor controller 314 for processing a signal transmitted from the sensor 750, a storage part or storage medium 315 for storing a sensitivity setting value of the sensor 750, and a host control part or controller 316 for controlling an operation of the display assembly 300 and providing the sensitivity setting value stored in the storage part 315 may be disposed on the display PCB 310.

Since the sensor control part 314 is disposed on the display assembly 300 that is spaced apart from the touch sensor assembly 500, the sensor control part 314 is connected to the sensor PCB 700 of the touch sensor assembly 500 through a cable connector 600. A signal of the sensor 750, which is detected by the touching manipulation at a position that is spaced apart from the touch sensor assembly 500 manipulated by the user, may be processed in the sensor control part 314.

The sensor control part 314 may receive a variation value in quantity of electricity that is generated in the sensor 750 (see also, e.g., FIG. 25, which is described hereinafter) to process the variation value in quantity of electricity as data, thereby transmitting the data into the host control part 316. The sensor control part 314 may also compare the variation value in quantity of electricity, which is inputted when the sensor 750 is manipulated, to the sensitivity setting value stored in the storage part 315 to determine whether the manipulation of the sensor 750 is effective. The sensor control part 314 may transmit the determined result into the host control part 316, and the user may recognize the manipulation according to the pushed degree when the touch part 12 of the front panel 20 is manipulated.

The host control part 316 may receive the result with respect to whether the sensor 750 is manipulated from the sensor control part 314 to display the result corresponding to the manipulation of the selected sensor or sensor array 750 on the display window 11 or transmit a signal for instructing an operation of the refrigerator 1 into a main control part that is separately provided or directly transmit the signal into electronic components for driving the refrigerator 1. The host control part 316 may be connected to the storage part 315, in which the sensitivity setting value of the sensor 750 is stored, to transmit and receive data with respect to the sensitivity setting value.

The storage part 315 may store the sensitivity setting value that is compared to the variation value in quantity of electricity that is generated when the sensor 750 is manipulated. An EEPROM or a non-volatile memory may be used as the storage part 315. The sensitivity setting value of the sensor 750 may be continuously stored in the storage part 315. Even though the refrigerator 1 is turned off and then turned on, the sensitivity setting value of the sensor 750 may be stored and maintained.

When the touch part or interface 12 is pushed, the sensor control part 314 may determine whether the pushing manipulation or touch input of the touch part 12 is effective to transmit the determined result to the host control part 316. When a special mode such as the sensitivity setting is activated, the sensitivity setting value stored in the storage part 315 may be adjusted to allow the user to recognize the manipulation of the touch part 12 at the desired sensitivity.

Figure 9:
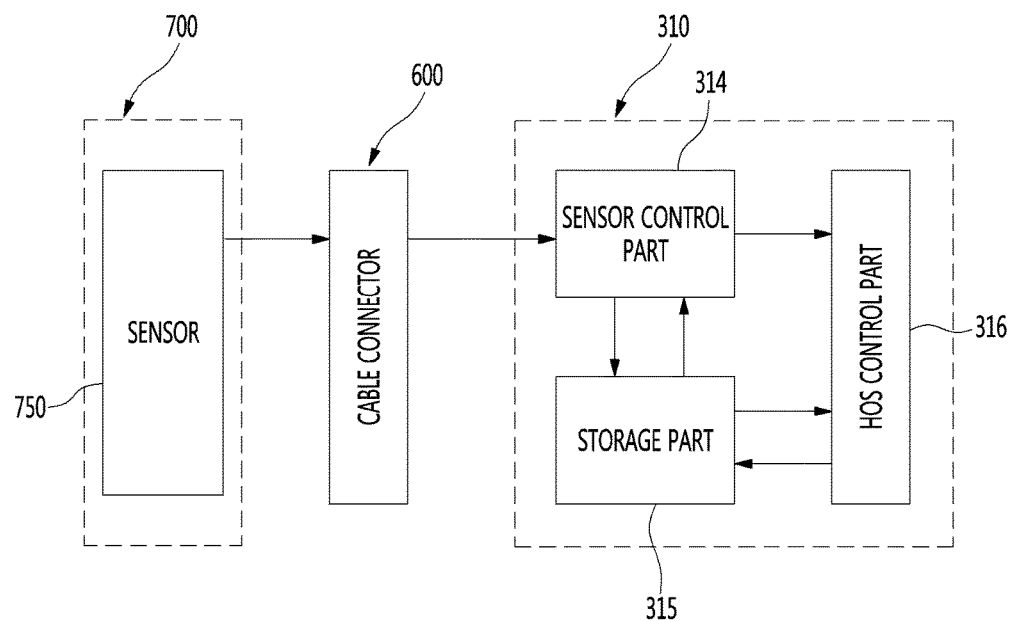
FIG. 9 is a block diagram illustrating connection between a sensor PCB and a display PCB.

A flow of the signal according to the manipulation of the touch part 12 will be described in more detail with reference to FIG. 9. When the user pushes one touch part 12 of the touch parts under a general manipulation situation, a pressure generated when the front panel 20 is deformed may be detected by the sensor 750. The sensor 750 may generate a quantity of electricity which varies based on the pressure of the touch input. The variation value in quantity of electricity may be transmitted into the sensor control part 314.

The inputted variation value in quantity of electricity and the sensitivity setting value stored in the storage part 315 may be compared to each other. If the inputted variation value in quantity of electricity satisfies the stored sensitivity setting value, the manipulation of the sensor 750 is successively recognized by the host control part 316. The host control part 316 may instruct an operation of the refrigerator by the touch part 12 selected according to the data transmitted from the sensor control part 314 to display the operation of the refrigerator on the display window 11.

In a state where the user successively pushes a specific touch part of the plurality of touch parts 12 to enter into the sensitivity setting mode, an input signal may be transmitted into the sensor control part 314, and data processed in the sensor control part 314 may be transmitted into the host control part 316. A new sensitivity setting value may be inputted into the storage part 315 according to the inputted data by the host control part 316.

The above-described manipulation may be continuously performed whenever a specific touch part 12 to be manipulated is pushed, and data may be transmitted into the host control part 316 via the sensor control part 314. Whenever the data is transmitted, the host control part 316 transmits a new sensitivity setting value into the storage part 315. Due to the above-described repeated processes, the user may adjust a sensitivity setting value for recognizing the manipulation of the touch part 12.

The sensor control part 314, the host control part 316, and the storage part 315 may be provided as one module on the display assembly 300. All of the sensor control part 314, the host control part 316, and the storage part 315 may be provided on one display PCB 310. If necessary, the sensor control part 314, the host control part 316, and the storage part 315 may be integrated with the display assembly 300 and provided on a plurality of PCBs and then connected to each other.

The sensor PCB 700 on which the sensor 750 is mounted may be separately provided with respect to the display PCB 310, and the sensor PCB 700 and the display PCB 310 may be disposed to be spaced apart from each other. The sensor PCB 700 and the display PCB 310 may be connected to each other by the cable connector 600.

The cable connector 600 includes a first cable connector 610 connected to the sensor PCB 700 of the touch sensor assembly 500 and a second cable connector 620 connected to the display PCB 310. The first and second cable connectors 610 and 620 may be connected to each other, when the display assembly 300 is mounted on the refrigerator door 10.

The cable connector 600 may have a total length greater than a distance from the touch sensor assembly 500 to the insertion hole 41. In the state where the touch sensor assembly 500 is mounted on the display cover 200, the cable connector 600 and the touch sensor assembly 500 may be connected to each other at an outside of the insertion hole 41, and then the display assembly 300 is inserted in the display cover 200.

Figure 5:
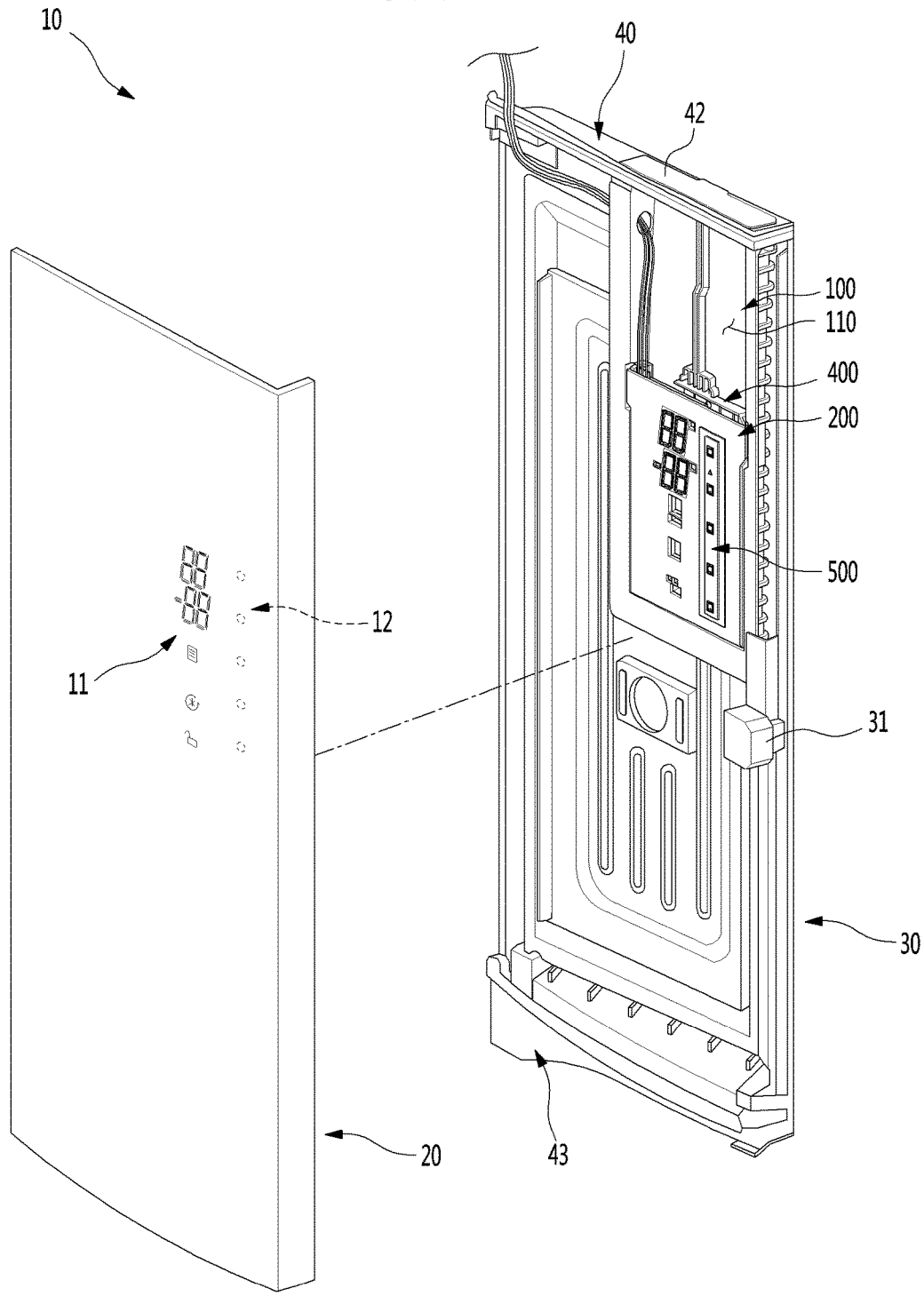
FIG. 5 is an exploded perspective view of the refrigerator door with a front panel separated.
Figure 6:
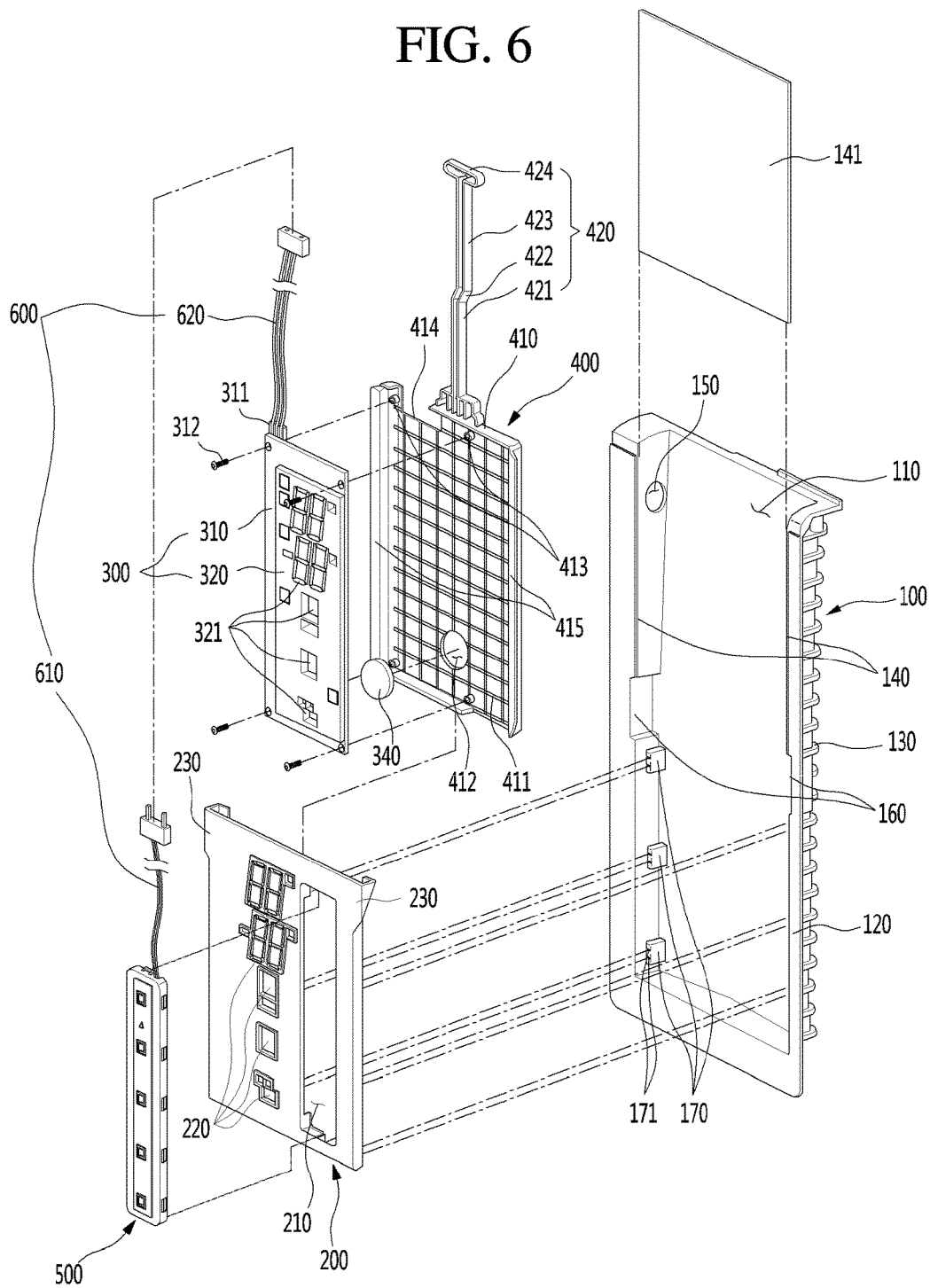
FIG. 6 is an exploded perspective view illustrating a coupled structure of a touch sensor assembly, a display cover, a display assembly, a display frame, and a frame according to an embodiment.

A display terminal 311 connected to the second cable connector 620 is disposed on a left side of an upper end of the display PCB 310 (when viewed in FIG. 5). This location minimizes an effect due to the static electricity which may be generated when the display terminal 311 is disposed at a position close to the touch sensor assembly 500.

The reflector 320 for guiding light so that the light emitted from the LED 313 travels to the first through hole 21 is disposed on the front surface of the display PCB 310. The reflector 320 may guide the light emitted from the LED 313 and also provides a space between the display PCB 310 and the display terminal 311 and the front panel 20 by a thickness of the reflector 320 to protect the display PCB 310 against the static electricity. Since the front panel 20 may be formed of a stainless steel material, and the display assembly 300 is disposed adjacent to the display window 11, the display PCB 310 may be vulnerable to the generated static electricity due to the above-described structure. However, since the reflector 320 spaces the display PCB 310 from the front panel 20, the display PCB 310 may be protected against the static electricity.

A third through hole 321 communicating with the second through hole 220 and the first through hole 21 may be defined in reflector 320 to correspond to the LED 313. When the display assembly 300 and the display frame 400 are mounted on the cover display 200, the first, second, and third through holes 21, 220, and 321 may be closely mounted or aligned to each other to communicate with each other. Thus, the light emitted from the LED 313 may be irradiated to the outside through the display window 11.

An acoustic output device or an actuator 340 may be disposed on the rear surface of the display PCB 310. The acoustic output device 340 may express an operation state of the refrigerator 1 by sound. For example, a speaker or buzzer may be used as the acoustic output device 340. The acoustic output device 340 may be disposed at a position corresponding to a frame hole 412 of the display frame 400. Thus, sound outputted from the acoustic output device 340 may be transmitted to the user outside the refrigerator door 10 to notify the operation state of the refrigerator 1.

The display PCB 310 is seated on the display frame 400. The display frame 400 may have a plate shape to allow the display PCB 310 to be seated thereon. An edge or flange 410 formed by bending along a circumference of the display frame 400 may be provided to form a space into which the display PCB 310 is accommodated. A sliding insertion part or rail 415 that is bent in both left/right directions is disposed on each of both left/right ends of the frame display 400. The sliding insertion part 415 may be inserted into a rail guide 240 disposed on the cover display 200. The display frame 400 may be mounted on the cover display 200 by the sliding insertion part 415.

Reinforcing ribs 411 disposed in length and width directions to form a lattice shape may be further disposed on an entire front surface of the display frame 400. The frame hole 412 may be defined in one side corresponding to the acoustic output device 340. A frame cutting part or frame cut-out 414 may be disposed on an upper end of the display frame 400. The frame cutting part 414 may be cut to a size corresponding to the display terminal 311 to prevent the display terminal 311 from interfering with the display frame 400. A boss 413 to which a screw 312 is coupled to fix the display PCB 310 is disposed on the display frame 400. The boss 413 may be coupled to the screw 312 and also support the display PCB 310 from a lower side.

A frame handle 420 extending upward is disposed on a central portion of the upper end of the frame display 400. The frame handle 420 may have a predetermined length so that the user holds and manipulate the frame display 400 when the frame display 400 is coupled to the display cover 200.

The frame handle 420 includes a first vertical part or first vertical extension extending from the frame display 400, an inclined part or extension 422 inclinedly extending backward from an upper end of the first vertical part 421, and a second vertical part or extension 423 extending upward from an upper end of the inclined part 422. The first and second vertical parts 421 and 423 may extend in parallel to each other and be connected to each other by the inclined part 422. A grip or grip part 424 to be grasped by the user may extend from an upper end of the second vertical part 423 in a transverse direction.

The user may grasp the grip part 424 to insert a lower end of the display frame 400 into the insertion hole 41 when the display frame 400 is inserted. The more the display frame 400 is inserted downward, the more the display frame 400 is closely attached to the rear surface of the display frame 200 due to the structure of the frame handle 420.

When the insertion hole cover 42 is closed in the state where the display frame 400 is completely inserted, the insertion hole cover 42 may contact the grip part 424. Although not shown, a handle coupling part or mold that is molded in a shape corresponding to that of the grip part 424 is disposed on a bottom surface of the insertion hole cover 42. When the insertion hole cover 42 is closed, an upper end of the frame handle 420 is coupled to the handle coupling part and thus maintained in the fixed state.

Figure 10:
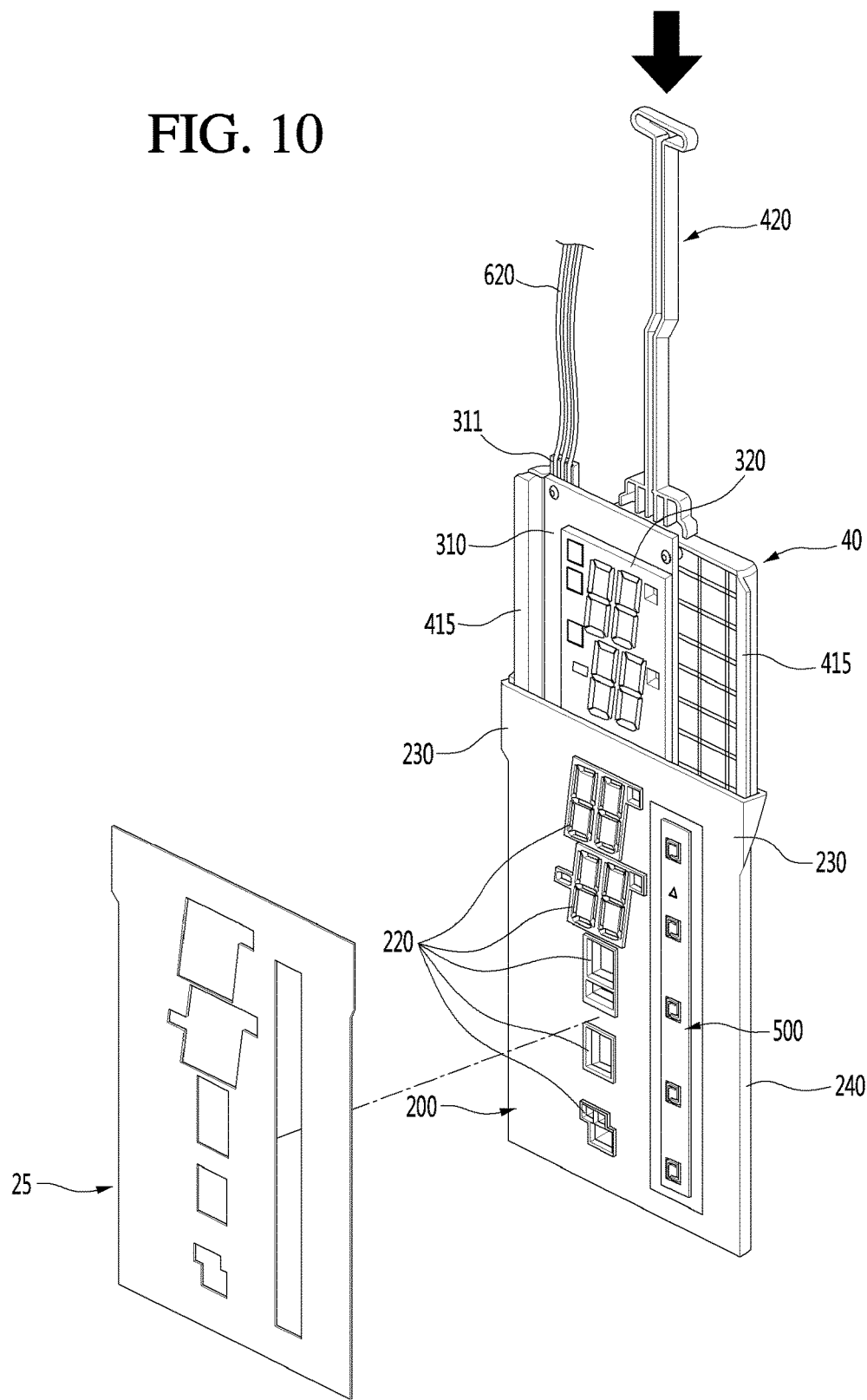
FIG. 10 is a perspective view illustrating a coupled structure between the display cover and the display frame.
Figure 11:
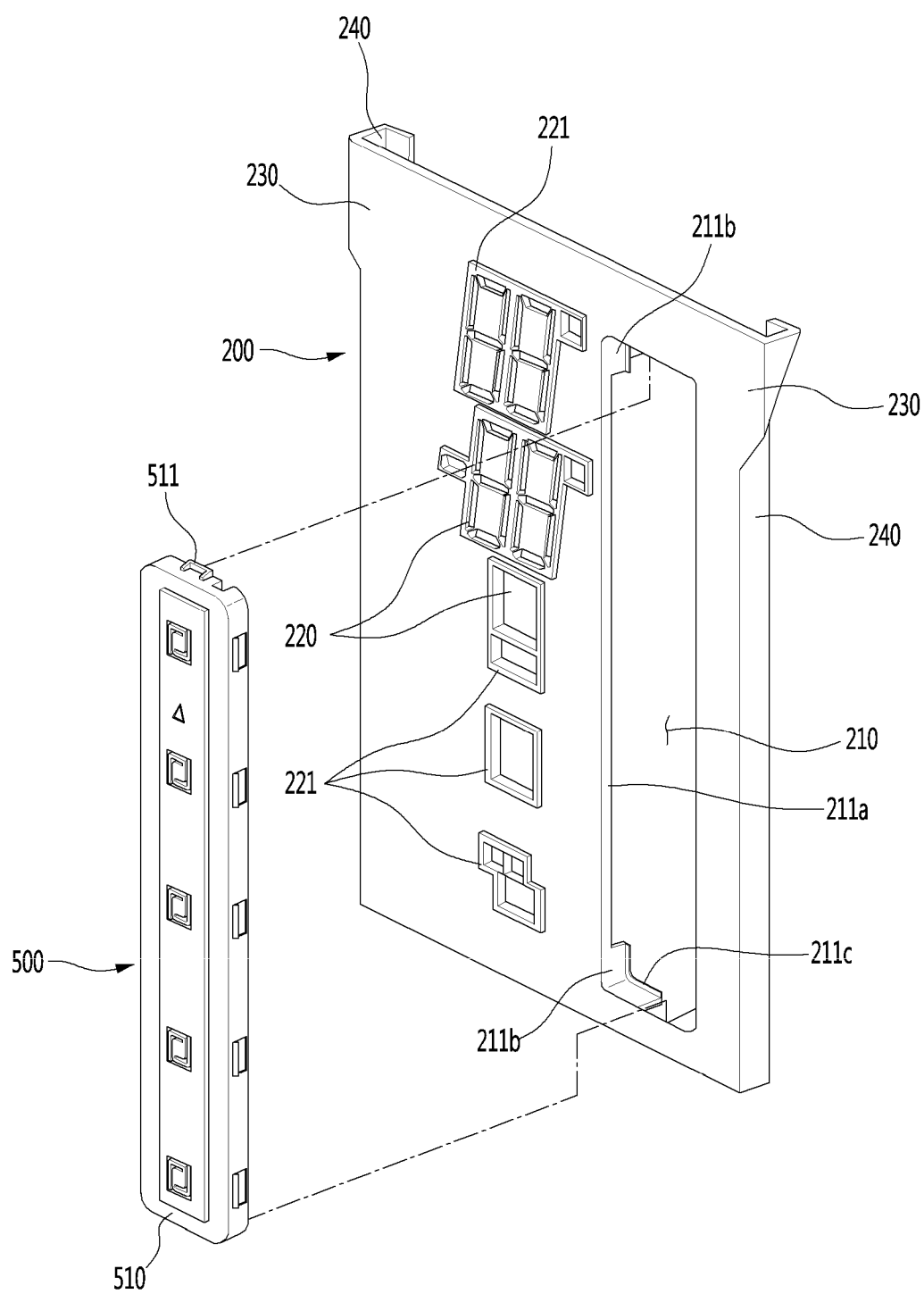
FIG. 11 is an exploded perspective view illustrating a coupled structure between the display cover and the touch sensor assembly.
Figure 12:
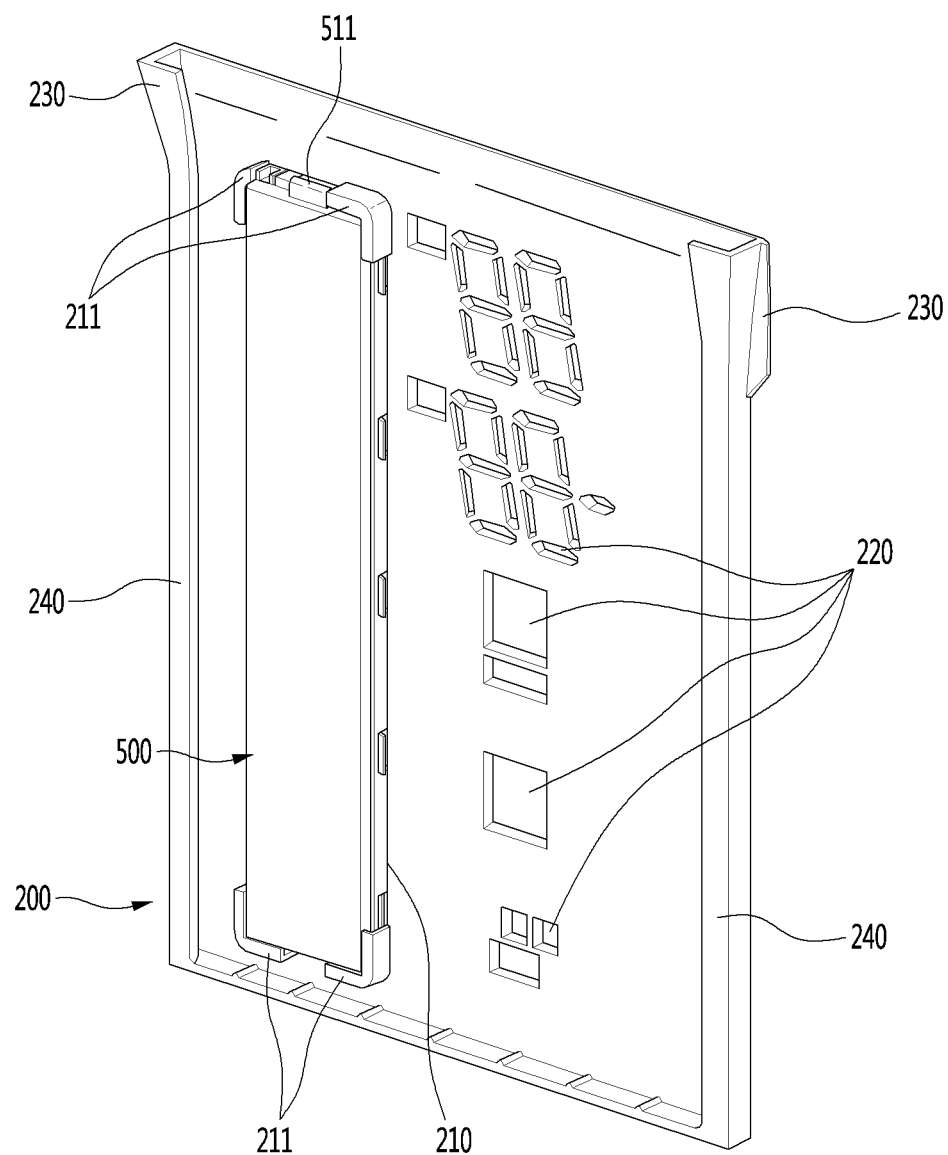
FIG. 12 is a rear perspective view of the display cover on which the touch sensor assembly is mounted.

As illustrated in FIGS. 10 to 12, the rail guide 240 is disposed on each of both left/right ends of the display cover 200. The rail guide 240 may be configured so that both ends of the display cover 200 are bent to allow the sliding insertion part or rail 415 to be inserted into the rail guide 240.

The rail guide 240 may have a wide upper end so that the sliding insertion part 415 is easily inserted. The rail guide 240 may have an inclined inner surface. The more the display frame is inserted, the more the display assembly 300 mounted on the display frame 400 is closely attached to the display cover 200.

When the display frame 400 is completely inserted, the sliding insertion part 415 may be fixed to the inside of the rail guide 240, and the reflector 320 may be completely closely attached to the rear surface of the display cover 200. The third through hole 321 may be defined to match the second through hole 220.

The display cover 200 has a flat front surface so that the display cover 200 is attached to the rear surface of the front panel 20. The accommodation part 210 into which the touch sensor assembly 500 is accommodated is defined at one side of the front surface of the display cover 200. The accommodation part 210 may be opened in a shape corresponding to that of the touch sensor assembly 500 so that the touch sensor assembly 500 is inserted. In the state where the touch sensor assembly 500 is mounted on the accommodation part 210, the front surface of the touch sensor assembly 500 may be disposed on the same plane as that of the display cover 200.

The accommodation part 210 may also extend backward along an opened circumference of the accommodation part 210. When the touch sensor assembly 500 is mounted, the sides 211a of accommodation part 210 may contact a circumferential surface of the touch sensor assembly 500 to allow the touch sensor assembly 500 to be maintained in the stably mounted state.

A housing support 211b may be disposed on each of four corners within the accommodation part 210. The housing support 211b may further extend from the accommodation part 210 to surround and/or support corners of a sensor housing defining an outer appearance of the touch sensor assembly 500. An end 211c of the housing support 211b may be bent inward to surround and support the circumferential surface and rear surface of the sensor housing. Even though the user pushes the front panel 20 to apply a pressure to the front panel 20, the touch sensor assembly 500 may not move backward, but be maintained in the assembled state.

A housing coupling part or tab 511 that is hooked with the inside of the accommodation part 210 is disposed on each of upper and lower ends of the sensor housing. The housing coupling part 511 may have a shape similar to a hook to allow the touch sensor assembly 500 to be maintained in the state in which the touch sensor assembly 500 is fixed to the inside of the accommodation part 210. The touch sensor assembly 500 is inserted into the accommodation part 210 from a front side, and the housing coupling part 511 is hooked and restricted to one side of the accommodation part 210. Thus, the touch sensor assembly 500 may be coupled to the cover display 200.

The second through hole 220 may be further defined in the front surface of the display cover 200. The second through hole 220 may be defined in a position corresponding to the first through hole 21 when the cover display 200 is attached to the rear surface of the front panel. The second through hole 220 may be opened in a shape corresponding to the seven segments. Holes having various other shapes for expressing other information may be defined. A blocking part or molding 221 is disposed around the second through hole 220. The blocking part 221 may be disposed outside the second through hole 220 to surround the second through hole 220. The blocking part 221 may protrude forward.

The adhesion member 25 that is provided for the adhesion of the cover display 200 may be attached to only an outer area of the blocking part 221. A gap between the first through hole 21 and the second through hole 220, which occurs by a thickness of the adhesion member 25 when the display cover 200 is attached, may be minimized to prevent a light leak phenomenon through the gap from occurring. The blocking part 221 may protrude to a height at which the light leakage is prevented. The blocking part 221 may protrude to a height that is less than or equal to that of the adhesion member 25 before the adhesion member 25 is pressed in consideration of the pressing of the adhesion member 25 that is attached to the front surface of the cover display 200.

Figure 13:
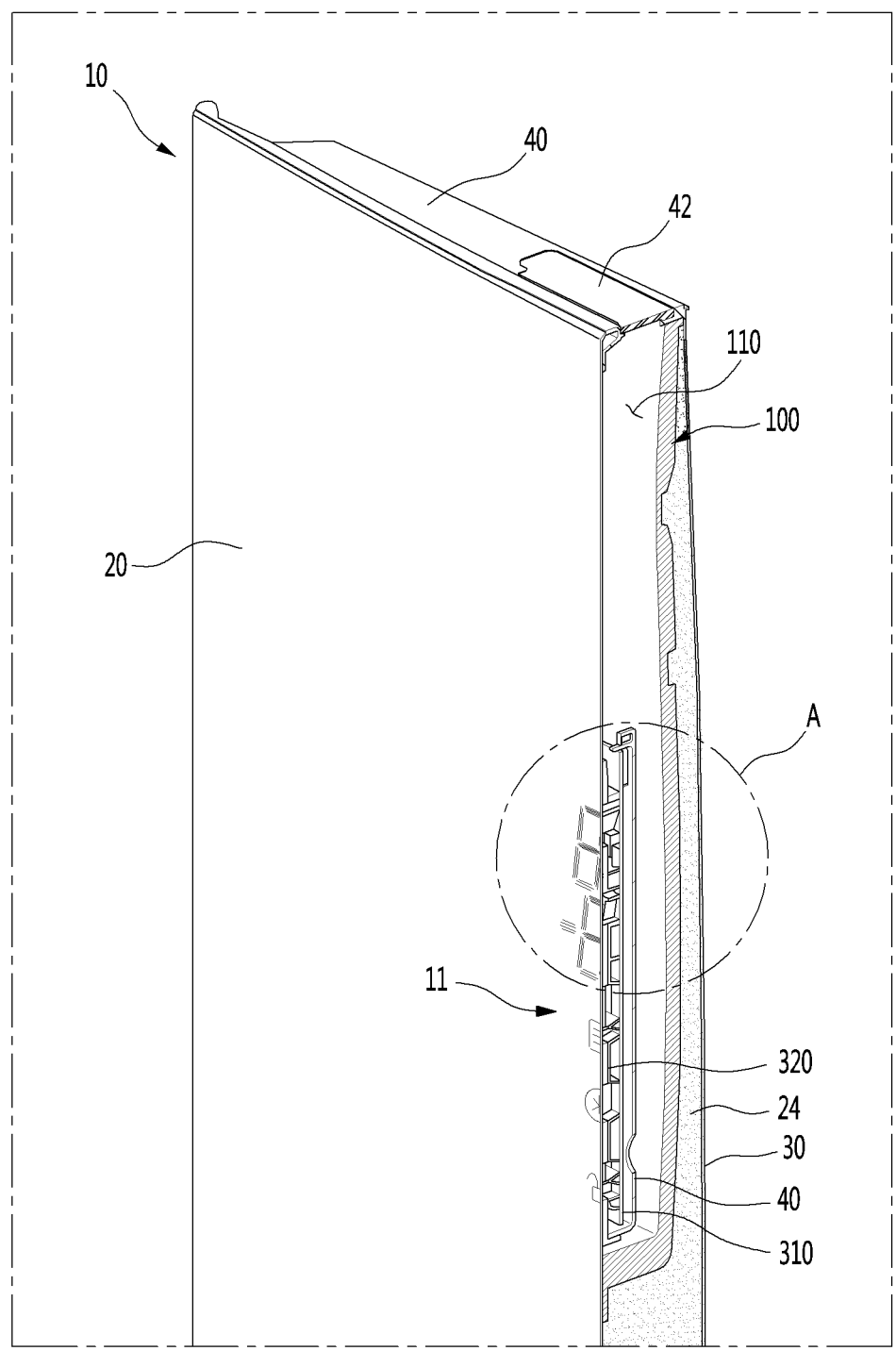
FIG. 13 is a cutaway perspective view taken along line 13-13' of FIG. 2.
Figure 14:
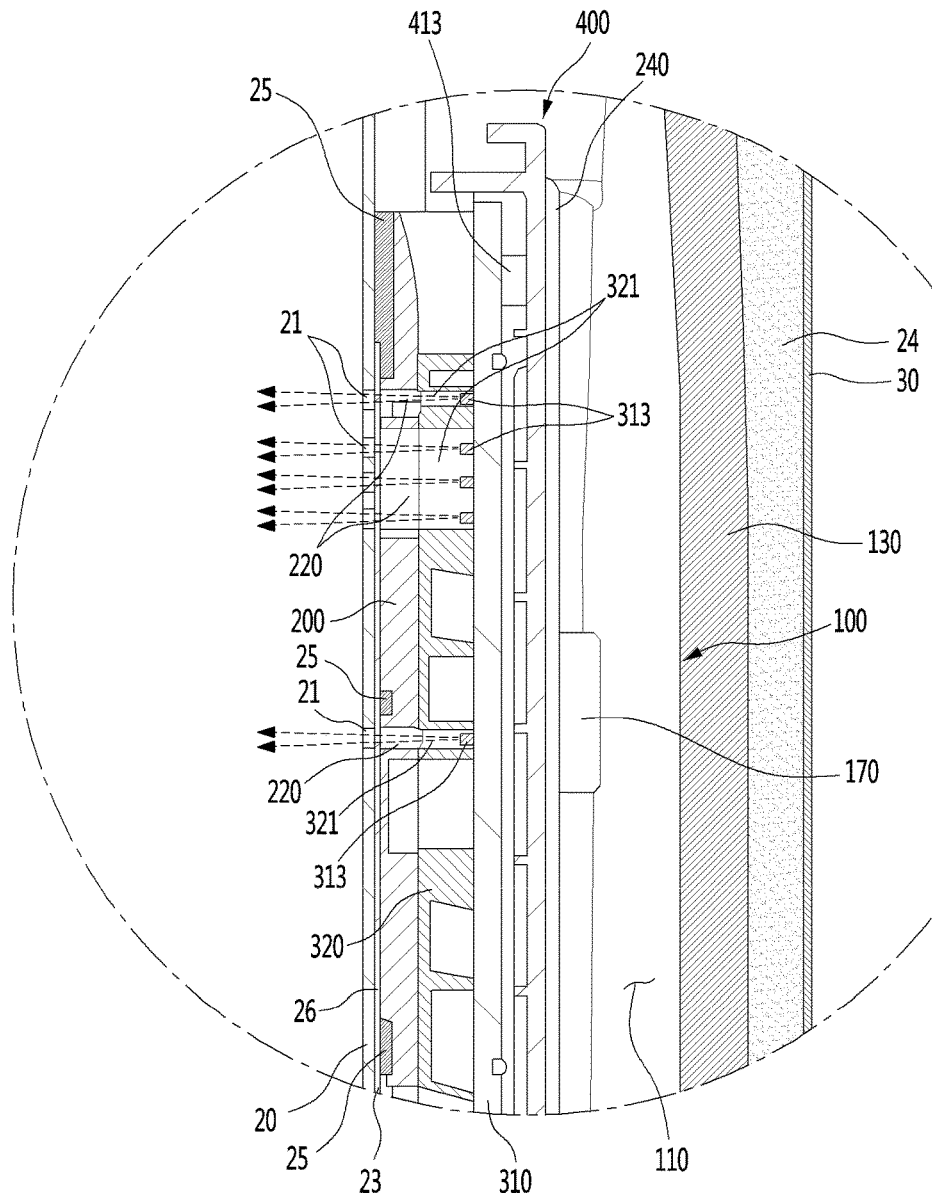
FIG. 14 is an enlarged cross-sectional view of a portion A of FIG. 13.

Referring to FIGS. 13 and 14, in the state where the cover display 200 is attached to the rear surface of the front panel 20 by using the adhesion member 25, the first and second through holes 21 and 220 may communicate with each other. The first through hole 21 has a substantially smaller size than that of the second through hole 220. The plurality of first through holes 21 may cover one second through hole 220.

When the display frame 400 is completely inserted so that the display assembly 300 is disposed inside the display cover 200, the third and second through holes 321 and 220 may be aligned to each other. The second and third through holes 220 and 321 may have the same size. When the reflector 320 is attached to the rear surface of the display cover 200, the second and third through holes 220 and 321 may completely overlap each other.

The third, second, and first through holes 321, 220, and 21 may communicate or align with each other. As a result, light emitted from the LED 313 may be irradiated to the outside of the refrigerator door 10 via the third, second, and first through holes 321, 220, and 21. A diffusion sheet may be attached to the rear surface of the front panel 20 in which the first through hole 21 is provided. The diffusion sheet 26 may diffuse light emitted from the LED 313 so that the light irradiated through the display window 11 is uniformly irradiated onto the display window 11. Alternatively, the diffusion sheet 26 may be attached to the front panel 20 corresponding to the display window 11 to cover the whole of the first through hole 21.

Figure 15:
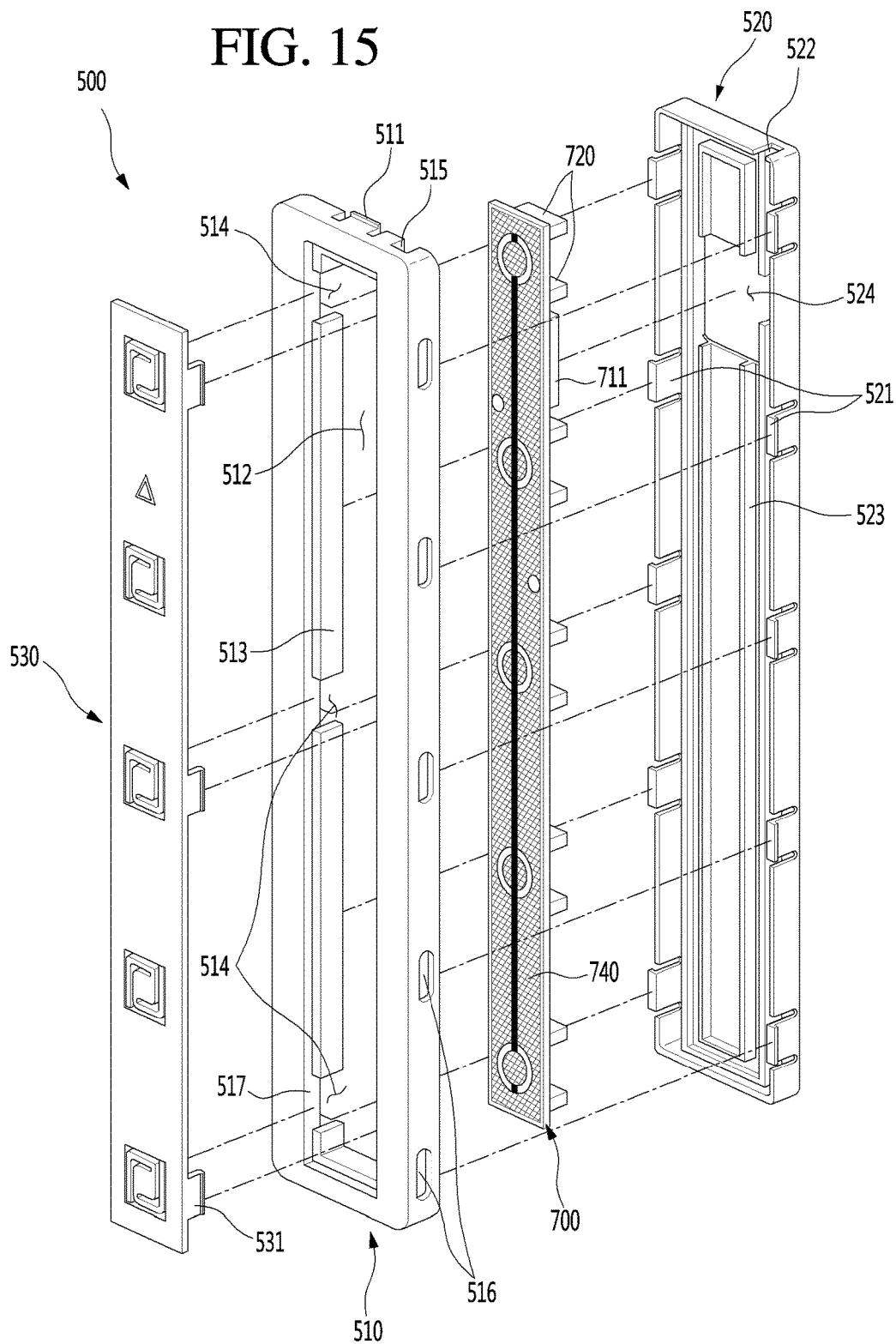
FIG. 15 is an exploded front perspective view of a touch sensor assembly according to an embodiment.
Figure 16:
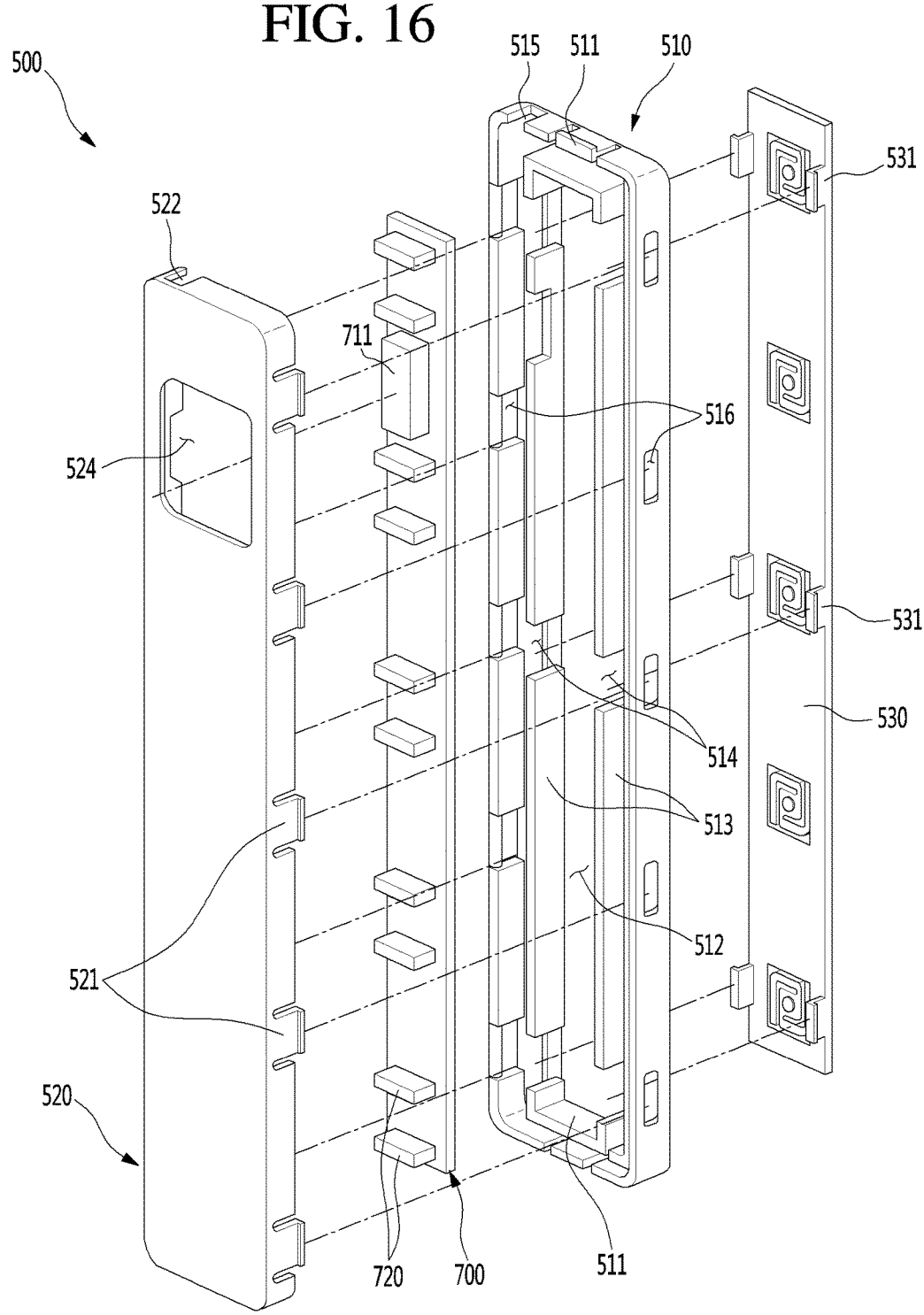
FIG. 16 is a rear exploded perspective view of the touch sensor assembly.

As illustrated in a front perspective of FIG. 15 and a rear perspective of FIG. 16, the touch sensor assembly 500 may include the sensor housing defining an entire outer appearance thereof, the sensor PCB 700 accommodated into the sensor housing, an elastic member 720 supporting the sensor PCB 700, and a touch booster 530 coupled to an opened front surface of the sensor housing. The sensor housing includes a housing cover 510 and a housing body 520. The housing body 520 is coupled to the housing cover 510 to define an outer appearance of a rear portion of the touch sensor assembly 500 and a space in which the sensor PCB 700 is mounted.

The housing cover 510 defines a front portion of the sensor housing. A housing coupling part or tab 511 for mounting the touch sensor assembly 500 on the cover display 200 is disposed on each of upper and lower ends of the housing cover 510. The housing cover 510 may have an exposed front surface in the state where the touch sensor assembly 500 is mounted in the accommodation part 210. The housing cover 510 may be attached to the rear surface of the front panel by using the adhesion member 25.

An opening 512 is defined in the front surface of the housing cover 510, and the touch booster or a touch transfer plate 530 is mounted on the opening 512. The touch booster 530 may transfer displacement of the front panel 20, which occurs when the user pushes the front panel 20, to a sensor 750 that will be described below. A detailed structure of the touch booster 530 will be described below in detail.

The opening 512 may has a size corresponding to that of the touch booster 530. When the touch booster 530 is mounted to the housing cover 512, the opening 512 may be covered by the touch booster 530. An extension rib 517 extending backward is disposed around the opening 512. The extension rib 517 may contact a circumference of the sensor PCB 700 to allow the sensor PCB 700 to move without being inclined when the sensor PCB 700 moves in a front/rear direction.

A booster support or plate 513 protruding inward and extending backward may be further disposed inside the opening 512. The booster support 513 may support a circumferential portion of the touch booster 530 from a rear side in the state where the touch booster 530 is mounted. Even though a pressure is applied to the touch booster 530, self-movement of the touch booster 530 to a rear side of the preset position may be prevented.

The booster support 513 is disposed along the opening 512, and a hook groove 514 is defined in the booster support 513. The hook groove 514 may be defined in a position corresponding to the hook 531 of the touch booster 530. The hook groove 514 may be formed by cutting a portion of the booster support 513. Alternatively, the hook groove 514 may be separately defined in one side of the housing cover 510 that is adjacent to the opening 512 except for the booster support 513.

The hook 531 and the hook groove 514 may be disposed on/in both left/right positions that face each other. The hook 531 and the hook groove 514 may be vertically disposed at a predetermined distance to prevent the touch booster 530 from being biased in one direction when the touch booster 530 is manipulated.

The hook groove 514 may extend in a front/rear direction. The hook 531 may be movable in the front/rear direction in a state where the hook 531 is disposed inside the hook groove 514. The touch booster 530 may be maintained in the state in which the touch booster 530 is coupled to the housing cover 510 and also move by a predetermined distance in the front/rear direction. Furthermore, the front surface of the touch booster 530 may further protrude than the housing cover 510 in the state where the touch booster 530 is assembled with the housing cover 510. Thus, when the touch sensor assembly 500 and the cover display 200 are attached to the front panel 20, the touch booster 530 may be always maintained in the state in which the touch booster 530 is closely attached to the rear surface of the front panel 20.

A cover coupling part or recesses 516 are disposed on a circumferential surface of the housing cover 510. The cover coupling part 516 may be a portion that matches the body coupling part 521 disposed on the housing body 520. A groove or hole with which the hook-shaped cover coupling part or tab 561 is hooked may be defined in the body coupling part or tab 521. The cover coupling part 516 may be disposed on a position at which the elastic member 720 is capable of being pressed when the cover coupling part 516 and the body coupling part 521 are coupled to each other.

When the housing cover 510 and the housing body 520 are coupled to each other, the elastic member 720 may be pressed to push the sensor PCB 700 and the touch booster 530 toward the front. The touch booster 530 may be maintained in a protruding state in which the touch booster 530 is closely attached to the front panel 20. Thus, when the user pushes the front panel 20, the touch booster may effectively detect the pushing of the front panel 20.

A wire hole 515 is defined in top surface of the housing cover 510. The wire hole 515 is opened so that the first cable connector 610 connected to the sensor terminal 711 on the sensor PCB 700 is accessible. The wire hole 515 may be defined in at least one side, e.g., 515 and 512 of the housing cover 510 and the housing body 520. A wire hole 522 may be defined in a circumferential top surface of the housing body 520. The wire hole 522 may be defined in the same position as the wire hole 515 of the housing cover 510 so that the first cable connector 610 is accessible.

A plurality of body coupling part or tabs 521 are disposed on a circumferential surface of the housing body 520, which is bent forward. The body coupling part 521 may be formed by cutting a portion of the circumferential surface of the housing body 520. The body coupling part 521 may be inserted into the cover coupling part 516 to maintain the state in which the housing cover 510 is coupled to the housing body 520.

The cover coupling part 516 and the body coupling part 521 may be disposed to be spaced a predetermined from each other and face each other at the same position of both left/right sides. The housing cover 510 and the housing body 520 may be coupled to each other with the same force at the same time to prevent the elastic member 720 from being inclined when assembled.

A mounting guide 523 is disposed on a bottom surface of the housing body 520. The mounting guide 523 guides mounting of a plurality of elastic members 720 so that the elastic member 720 attached to the sensor PCB 700 is accommodated. The mounting guide 523 may have a shape corresponding to that of the sensor PCB 700 to provide a space corresponding to a width of the elastic member 720. The elastic member 720 may be disposed inside the mounting guide 523, and both left/right surfaces of the mounting guide 523 may support both left/right ends of the elastic member 720. The mounting guide 523 may stably support the elastic member 720 to prevent the elastic member 720 from being twisted or inclined in one direction when the elastic member 720 is pressed.

A terminal hole 524 is opened from the bottom surface of the housing body 520 corresponding to the sensor terminal 711 disposed on the sensor PCB 700. The terminal hole 524 may have a shape corresponding to that of the sensor terminal 711. The sensor terminal 711 may be exposed through the terminal hole 524. Even though the sensor PCB 700 moves in the front/rear direction, the sensor terminal 711 may not interfere with the bottom of the housing body 520. Since the first cable connector 610 is coupled to a side surface of the sensor terminal 711, the coupled state between the first cable connector 610 and the sensor terminal 711 may be seen through the terminal hole 524.

The sensor PCB 700 is supported by the elastic member 720 inside the sensor housing in a state where a spacer 730, a sensor 750, and a conductive foil 740 (illustrated in FIG. 17) are disposed. Also, the touch booster 530 is mounted in the opening 512 so as to be movable in the front/rear direction. The displacement occurring when the front panel 20 and the conductive foil 740 contact each other and are pushed may be immediately transmitted into the sensor 750.

As illustrated in FIGS. 17 to 20, the sensor PCB 700 is formed of a plastic material, and a copper film 712 constituting a circuit is printed on a surface of the sensor PCB 700. The sensor 750 for detecting push displacement of the front panel 20, which occurs by the user's touch, is disposed on the front surface of the sensor PCB 700.

A piezo-sensor may be used as the sensor 750. A ceramic device or sheet 752 may be attached to a top surface of a metal plate 751. The metal plate 751 may be elastically deformable according to a pressure of the touch manipulation of the front panel 20. A variation in quantity of electricity occurs due to the pressure on the ceramic device 752. Although the sensor 750 has a circular shape in the current embodiment, the sensor 750 may have a different shape. The sensor 750 may be provided in plurality along the sensor PCB 700. A sensor support 713 is disposed on the front surface of the sensor PCB 700 on which the sensor 750 is mounted.

The sensor support 713 may be defined by a groove having a diameter that is less than a size of the sensor. The sensor support 713 may not support a circumference of the sensor 750, but support a circumference of the metal plate 751. The sensor support 713 may support the lower circumference of the metal plate 751. The sensor support 713 may have a projection or disc shape for supporting the circumference of the metal plate 751, but may not have a groove shape. The sensor support 713 may have a size that is less than a diameter of the metal plate 751, but greater than a diameter of the ceramic device 752. The metal plate 751 may be deformed by a pressure that is applied from a front side, and thus, the ceramic device 752 may effectively detect a variation in pressure.

A common contact point 714 connected to the plurality of sensors through the circuit is disposed on one side of the sensor PCB 700. The common contact point 714 connects bottom surfaces of the plurality of sensors 750 to each other. When the conductive foil 740 adheres, the common contact point 714 may contact a conductive line 741 of the conductive foil 740 and be connected to a negative electrode of each of the plurality of sensors 750 to electrically connect the sensor.

A mounting display part or mounting alignment aid 715 for displaying an accurately mounted position of the elastic member 720 is disposed on the rear surface of the sensor PCB 700. The mounting display part 715 may be formed through printing or processing. The mounting display part 715 may be used to alignment position or placement of the elastic member 720.

The mounting position of the elastic member 720, e.g., the position of the mounting display part 715, may be disposed on both left/right sides (when viewed in FIG. 17) with respect to the sensor 750. The mounting position of the elastic member 720, e.g., the position of the mounting display part 715, may be disposed outside an outer end of the sensor 750. The elastic member 720 may be disposed to prevent the elastic member 720 from interfering with the sensor 750, and to prevent the detectability of the sensor 750 from being deteriorated. Furthermore, the plurality of elastic members 720 may be disposed to be spaced a predetermined distance from the sensor 750 to apply substantially the same pressure to the sensor PCB 700.

The plurality of sensors 750 may be disposed in the same extension line as or in a alignment with the body coupling part 521 and the cover coupling part 516. As illustrated in FIGS. 14 and 15, the body coupling part 521 and the cover coupling part 516 may be disposed on the same extension line as both left/right sides of the sensor 750. The body coupling part 521 and the cover coupling part 516 may be disposed between the pair of elastic members 720 that are adjacent to the sensor 750. The body coupling part 521 and the cover coupling part 516 may be disposed on both left/right sides of one sensor 750, and the pair of elastic members 720 may be disposed in a direction of the body coupling part 521 and the cover coupling part 516. Thus, a pressure may be uniformly applied to the whole sensor PCB 700 disposed in the sensor housing, and the plurality of sensors 750 may detect the user's manipulation signal under the same or substantially similar condition.

The spacer 730 is attached to the front surface of the sensor PCB 700. The spacer 730 may be configured to bond the sensor PCB 700 to the conductive foil 740. An adhesion member such as a double-sided tape may be used as the spacer 730. The spacer 730 may have a size corresponding to that of each of the sensor PCB 700 and the conductive foil 740. The spacer 730 also may have a predetermined thickness so that the conductive foil 740 contacts a top surface of the sensor 750 and the common contact point 714 at an adequate height thereof.

A sensor hole 731 is punched or provided at a position corresponding to that of the sensor 750. The sensor hole 731 may have a size greater than that of the sensor 750 to accommodate the sensor 750 therein. When the sensor 750 operates, there is no interference between the sensor 750 and the sensor hole 731. The sensor hole 731 may be provided in number corresponding to the number of sensors 750. A vent hole 732, which is cut by a predetermined length, is defined in each of the sensor holes 731.

Bubbles generated when the spacer 730 is attached to the front surface of the sensor PCB 700 may be discharged through the vent hole 732. The vent hole 732 may be defined and extended along a longitudinal direction of the spacer 730 from an edge of the sensor hole 731. All of the vent holes 732 are extended in one direction. Thus, the spacer 730 may be attached to the front surface of the sensor PCB 730 in a direction in which the vent hole 732 extends from the edge of the sensor hole 731 in order to discharge the bubbles through the vent hole 732.

When the spacer 730 and the conductive foil 740 are attached, guide parts may be provided on the spacer 730 and the conductive foil 740 so that the spacer 730 and the conductive foil 740 are aligned accurately.

The guide parts may be through holes or alignment holes 733 and 744 that are defined in the spacer 730 and the conductive foil 740. The through holes 733 and 744 may be provided in plurality along the spacer 730 and the conductive foil 740 to align with each other. The through holes 733 may be alternately disposed in such a manner that one of the through holes 733 is disposed near one edge of the spacer 730 and the other of the through holes 733 is disposed near the other edge of the spacer 730. The other edge is opposite to the one edge, and the one of the through holes 733 is apart from the other of the through holes 733 in the longitudinal direction of the spacer 730. The through holes 744 are disposed in the conductive foil 740 in the same manner as the through holes 733. An alignment rod may be vertically disposed on the sensor PCB 700 at a position corresponding to each of the through holes 733 and 744. Thus, the alignment rod may pass through each of the through holes 733 and 744 to successively attach the spacer 730 and the conductive foil 740 on to the sensor PCB 700. The spacer 730 and the conductive foil 740 may be attached to accurate positions by a coupling of the through holes 733 and 744 using the alignment rod. The through holes 733 and 744 of the spacer 730 and the conductive foil 740 may be spaced a predetermined distance from the sensor 750 disposed on the sensor PCB 700 to prevent errors of the plurality of sensors 750 from occurring. After attaching of the spacer 730 and the conductive foil 740 on to the sensor PCB 700, the alignment rod may be removed from the sensor PCB 700.

The conductive foil 740 may be formed of a resin film material such as PET. The conductive foil 740 may have a size corresponding to that of each of the sensor PCB 700 and the spacer 730. A conductive line 741, which connects the plurality of sensors 750 to the common contact point 714, may be disposed on the conductive foil 740. The conductive line 741 may be printed on a bottom surface of the conductive foil 740 by using a silver material. The surface on which the conductive line 741 may adhere to the spacer 730, and also, contact the sensor 750 and the common contact point 714.

An inner guide line 742 and an outer guide line 743 may be printed on the conductive foil 740 so that the sensors 750 are accurately aligned in position. The inner guide line 742 may have a size corresponding to that of the ceramic device 752, and the outer guide line 743 may have a size corresponding to that of the metal plate 751. When the sensors 750 are mounted accurately, the ceramic device 752 may be disposed in the inner guide line 742, and the metal plate 751 may be disposed in the outer guide line 743. The inner region of the conductive foil 740 defined by the inner guide line 742 includes meshed or lattice metallic pattern, and the conductive line 741 connects the inner regions. The conductive line 741 may connect the common contact point 714 to the top surface (via inner region) of the sensor 750, i.e., the negative electrode to allow the sensor 750 to be electrically connected.

Figure 21:
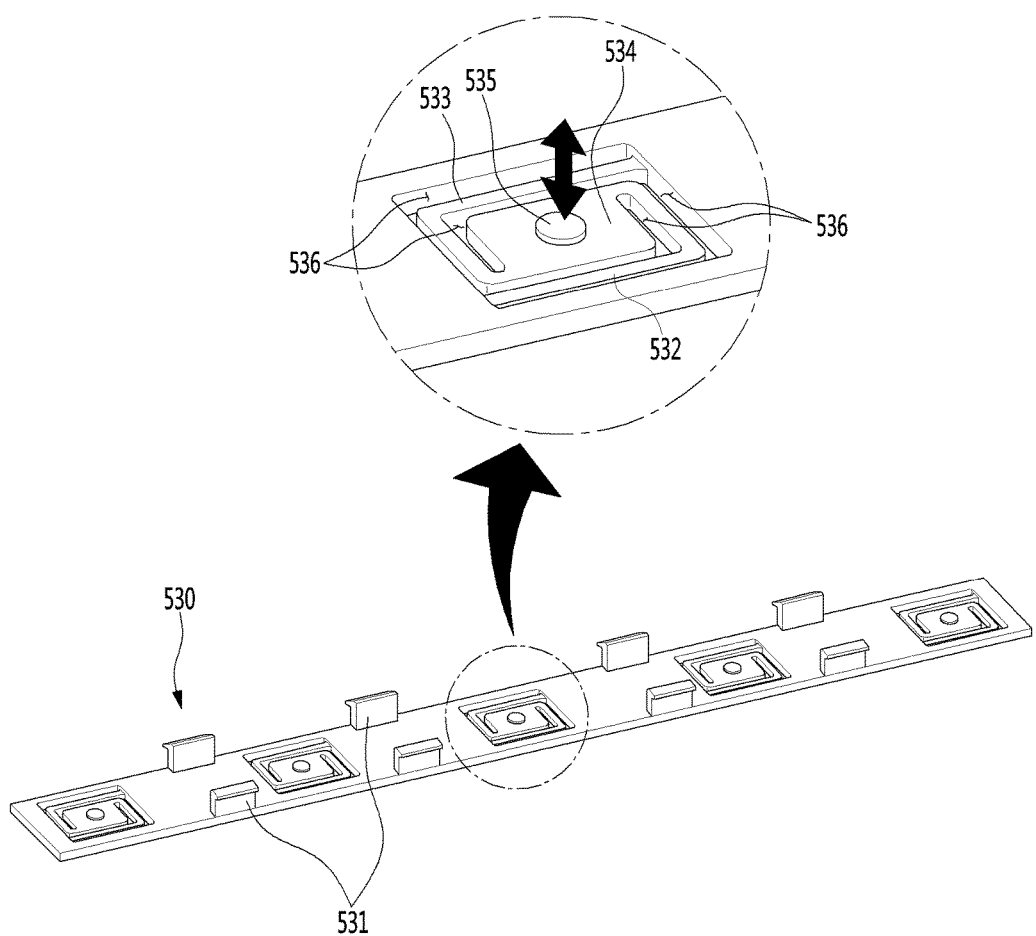
FIG. 21 is a rear perspective view of the touch booster that is a main component of the touch sensor assembly.

As illustrated in FIG. 21, the touch booster 530 has a size corresponding to that of the opening 512 of the housing cover 510 to cover the opening 512. A hook 531 is disposed on each of both left/right ends of the housing cover 510. The hook 531 may be coupled to the hook groove 514 defined in the housing cover 510 and provided in plurality with a predetermined distance. The hook 531 may moves in the front/rear direction within the hook groove 514.

A plurality of elastically deformable parts or elastic spring having the number corresponding to that of sensors 750 are disposed on the touch booster 530. The elastically deformable parts may be disposed at positions corresponding to those of the touch part 12 of the front panel 20 and the sensor 750. Each of the elastically deformable parts may have an elastically deformable structure in which the elastic deformable part is movable in the front/rear direction. When the user pushes the touch part 12, the front panel 20 may be deformed, and thus, a portion corresponding to an area of the touch part 12 may move in a rear direction to press the sensor 750. When the user's hand is separated from the touch part 12, the elastically deformable part may return to its original position.

The elastically deformable part may include a first extension part 532 extending from one side of the opened region of the touch booster 530, a second extension part 533 extending from a position opposite to the first extension part 532, and a common part 534 disposed at a central portion to connect the first extension part 532 to the second extension part 533.

Each of the first and second extension parts 532 and 533 may have a relatively narrow width so that the common part or central region 534 is movable. Each of the first and second extension parts 532 and 533 may extend to a sufficient length and be bent at least once. Thus, the first and second extension parts 532 and 533 may be easily elastically deformable. Each of the first and second extension parts 532 and 533 may extend and be curved along a circumference of the common part 534. The first and second extension parts 532 and 533 may be symmetrical to each other with respect to the common part 534. An area except for the first and second extension parts 532 and 533 and the common part 534 may be spirally cut in a central direction of the common part 534 to form a cut part or a cut-out 536. The area may be cut along circumferences of the first and second extension parts 532 and 533 and the common part 534.

A protrusion 535 protruding downward is disposed on a bottom surface of the common part 534. The protrusion 535 may be disposed at a center of the common part 534 to correspond to a center of the sensor 750. Thus, when the common part 534 moves backward, the common part 534 may press the center of the sensor 750.

Figure 22:
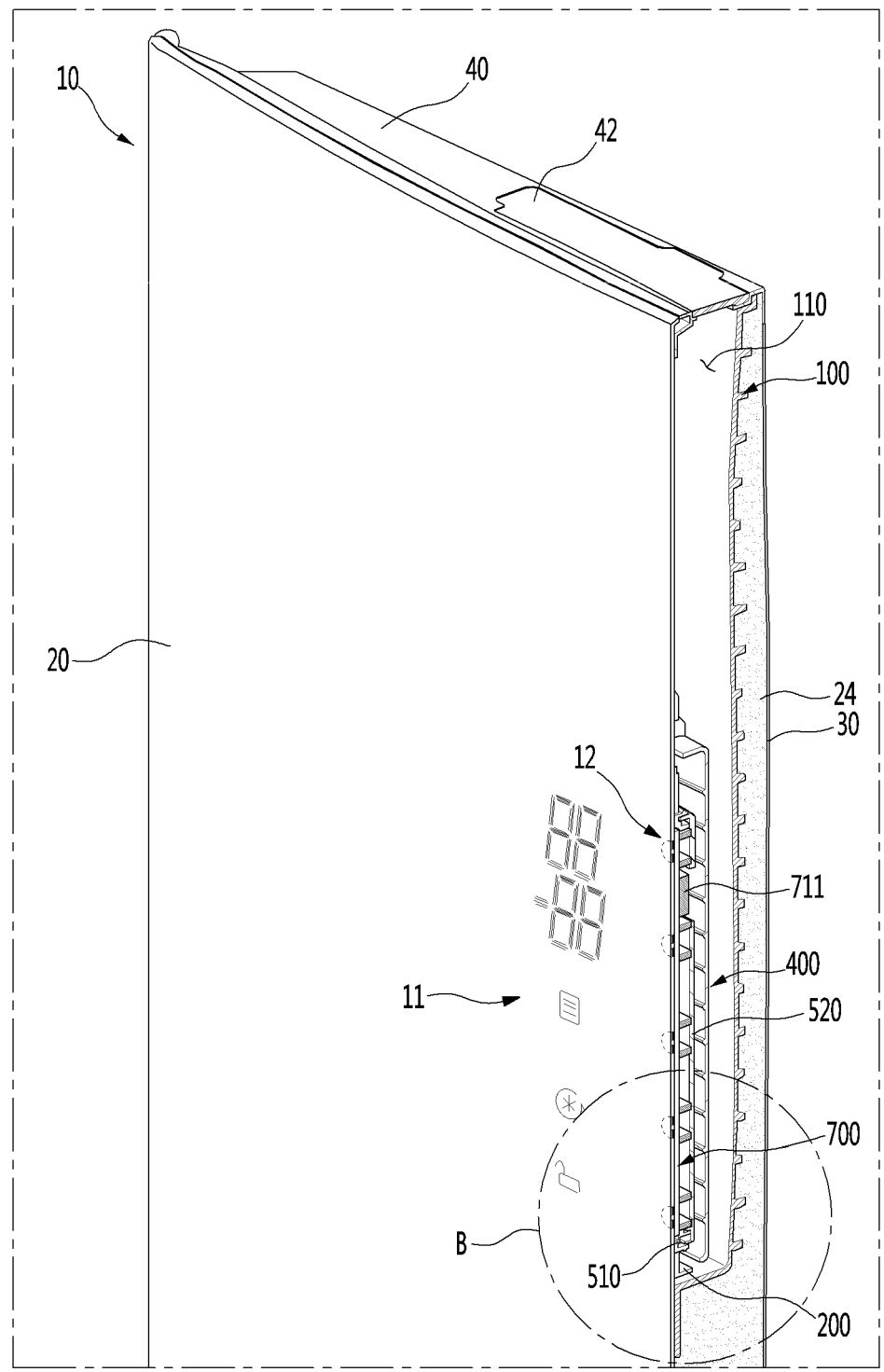
FIG. 22 is a cutaway perspective view taken along line 22-22' of FIG. 2.
Figure 23:
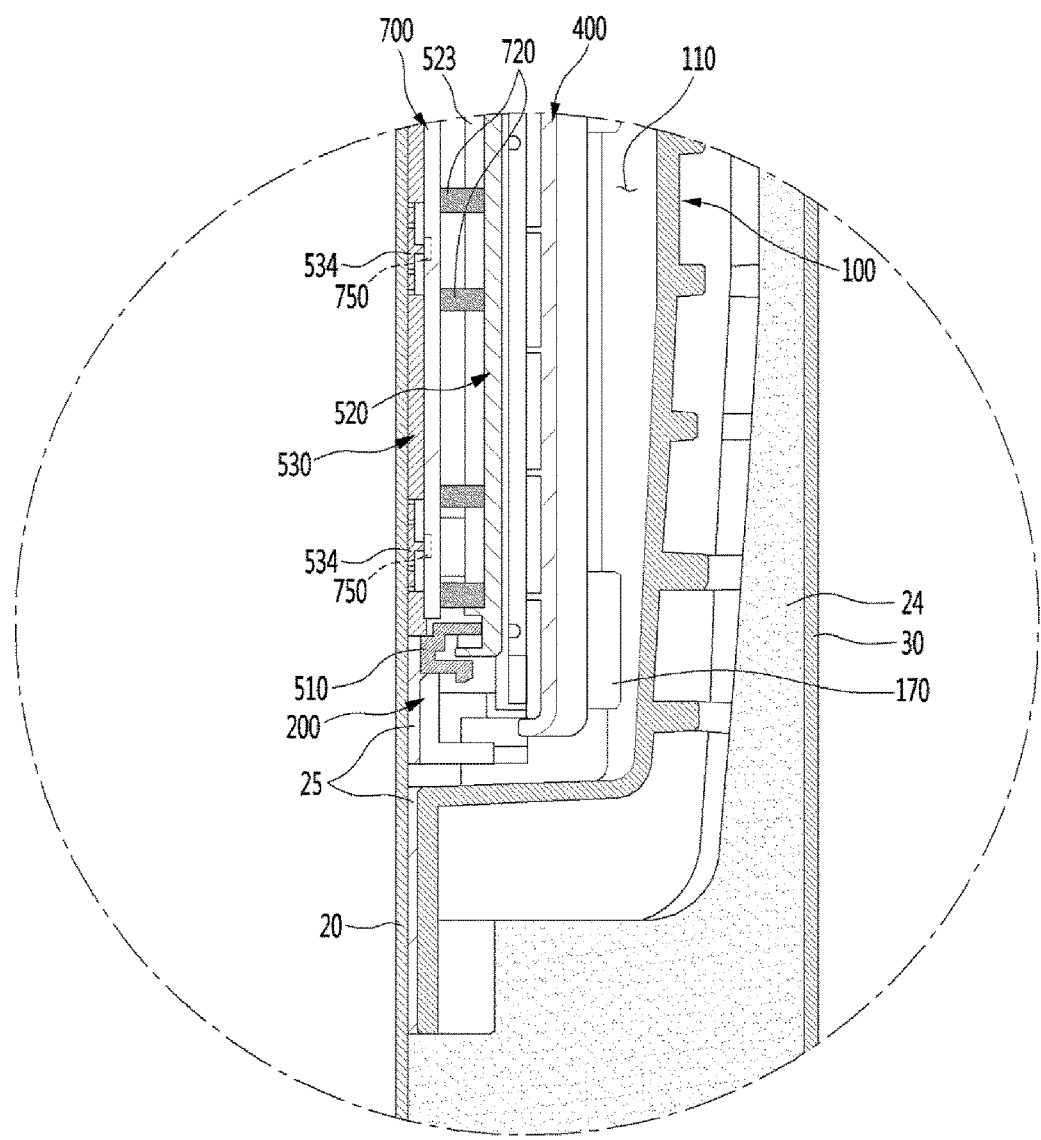
FIG. 23 is an enlarged cross-sectional view of a portion B of FIG. 22.
Figure 24:
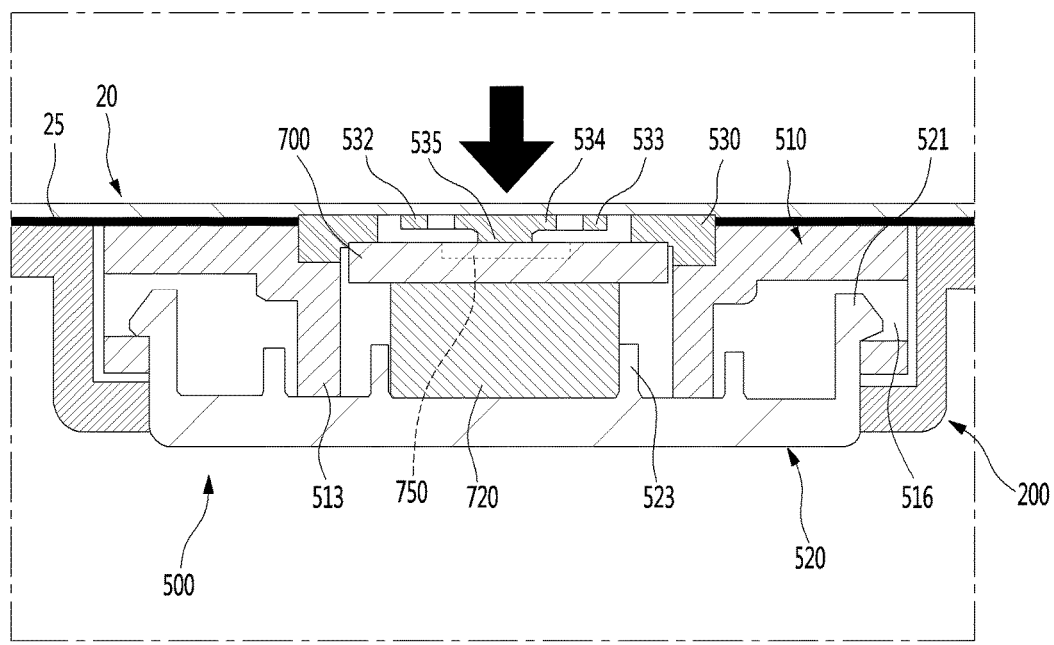
FIG. 24 is a cross-sectional view illustrating a state in which the touch sensor assembly is mounted.

As illustrated in FIGS. 22 to 24, the touch sensor assembly 500 is attached to the front panel 20 in a state where the touch sensor assembly 500 is mounted on the display cover 200. The adhesion member 25 may be attached to the front surface of the display cover 200 and the front surface of the housing cover 510 so that the display cover 200 and the touch sensor assembly 500 adhere to the rear surface of the front panel 20.

The adhesion member 25 may not be provided on the touch booster 530, and the touch booster 530 may be closely fitted to the rear surface of the front panel 20. When the touch sensor assembly 500 is assembled, the elastic member 720 may push the sensor PCB 700 forward while being pressed. Thus, the sensor PCB 700 may be closely fitted to the touch booster 530. The touch booster 530 may be movable in the front/rear direction in the state where the touch booster 530 is coupled to the housing cover 510. The touch booster 530 may further protrude forward from the front surface of the housing cover 510 by the restorative force of the elastic member 720.

Although the display cover 200 and the housing cover 510 adhere to the front panel 20 by the adhesion member 25, the front surface of the touch booster 530 may be in substantially continuous contact to the rear surface of the front panel 20. In this state, when the user touches the touch part 12 of the front panel 20, displacement may occur on an area of the manipulated or touched front panel 20. The displacement of the front panel 20 may be immediately transmitted into the sensor 750 through the touch booster 530 to press the sensor 750. The sensor 750 may detect the user's manipulation or touch pressure. The elastic member 720 may be further pressed according a pressure during the manipulation thereof. The touch booster 530 may move backward by the coupling between the hook 531 and the hook groove 514.

When the user's hand is separated from the touch part 12, the sensor PCB 700 and the touch booster 530 may move again forward by a restoring force of the elastic member 720, a restoring force of the touch booster 530, and a restoring force of the metal plate 751 of the sensor 750 to return to its original state. In a refrigerator 1 according to an embodiment, when the user manipulates the touch part 12, the front panel 20 may be deformed. A variation in quantity of electricity may occur due to the pressure by the deformation of the front panel 20. The variation value may be transmitted into the sensor control part 314 to detect user's touch manipulation. When an area of the touch part 12 displayed on the front panel 20 is pushed, the user's manipulation may be accurately recognized or detected.

On the other hand, when an area except for the area of the touch part 12 is pushed by the user, it may be difficult to recognize an accurate operation through the sensor 750. In this state, the sensor 750 may not recognize the pushing manipulation. Further, when an area between the plurality of touch parts 12 is pushed, a situation in which two sensors recognize the pushing manipulation at the same time due to structural characteristics of the front panel 20 having one plate shape may occur. In this case, it may not be possible to clearly instruct or recognize a desired operation of the refrigerator 1.

Further, when the door 10 is closed, an impact may occur due to structural characteristics of the refrigerator door 10. For example, the front panel 20 may be temporarily deformed by the impact, or the plurality of sensors 750 may detect the impact as a user input. Hence, malfunction may occur due to the undesired recognition of the sensor 750.

To prevent the malfunction of the sensor 750 from occurring, in the touch sensor assembly 500, the sensor PCB 700 may be supported by the elastic member 720, and the sensor 750 may be mounted on the sensor PCB 700. The elastic member 720 supports the sensor PCB 700 at a position corresponding to an outer end of the sensor 750 at each of the sides of the sensor due to characteristics in position thereof.

When an area between the plurality of touch parts 12 is pushed, force applied by the user may not be transmitted into the sensor 750, but leak through the elastic member 720. The force applied to the front panel 20 may act on the elastic member 720 to reduce the force transmitted into the sensor 750, thereby preventing the adjacent sensor from recognizing the touch manipulation. The impact occurring when the door 10 is closed may be absorbed and buffered by the elastic member 720 to prevent a pressure transmitted into the sensor 750 from being minimized, thereby preventing the sensor from being mal-operated or malfunctioned. The touch sensor assembly 500 according to an embodiment may prevent the user's erroneous manipulation from occurring through the other structure (described hereinafter) in addition to the above-described structure.

Figure 25:
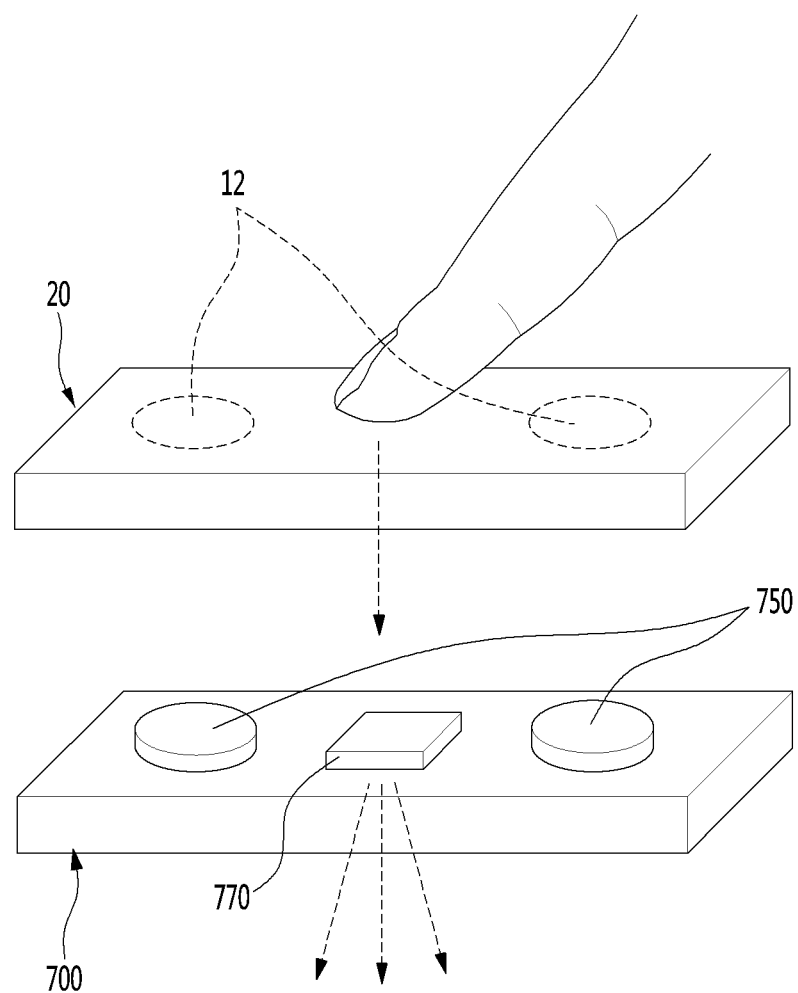
FIG. 25 is a schematic view illustrating a structure of a main component of a touch sensor assembly according to another embodiment.

FIG. 25 is an exploded front perspective view of a touch sensor assembly according to another embodiment. A plurality of sensors 750 may be disposed to be spaced a predetermined distance from each other on the sensor PCB 700, and a push support member or buffer 770 may be disposed between the sensors 750. The push support member 770 may be disposed between the front panel 20 and the sensor PCB 700. The push support member 770 may have a height greater than that of the sensor 750.

Even though the user does not push the touch part 12 of the front panel 20, but push an area between the touch parts 12 of the front panel 20, the applied force may be leaked through the push support member 770, and thus the pressure may not be applied to or detected by the sensors 750 disposed on both sides of the push support member 770. The push support member 770 may support the front panel 20 to structurally prevent push deformation of the front panel 20 from occurring, thereby preventing simultaneous recognition of the sensors 750 due to the deformation of the front panel 20 from occurring.

Figure 26:
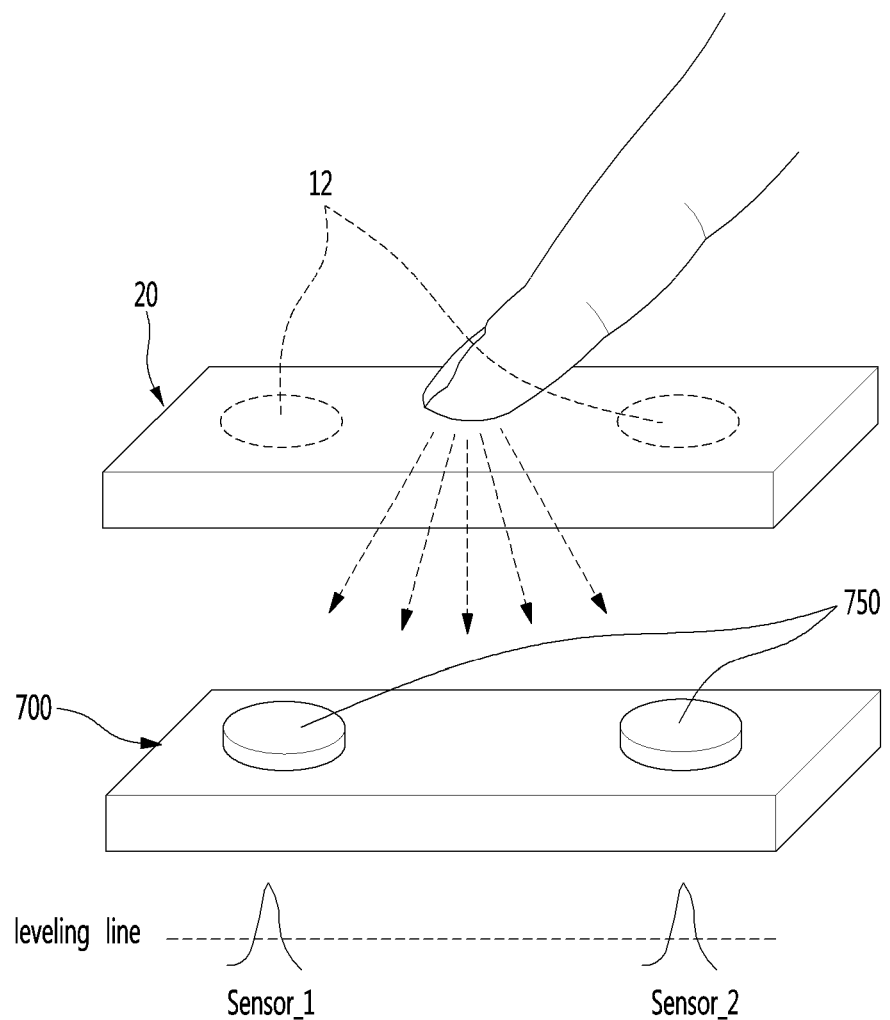
FIG. 26 is a schematic view illustrating a structure of a main component of a touch sensor assembly according to further another embodiment.

FIG. 26 is a schematic view illustrating a structure of a main component of a touch sensor assembly according to further another embodiment. When the push signals of adjacent touch parts 12 are generated at the same time in the sensor control part 314, the sensor control part 314 may ignore the inputted signal and may not process the push signals. For example, if the variation in quantity of electricity is above a preset quantity occurs from adjacent two sensors 750 at the same time, the sensor control part 314 may determine this state as the erroneous manipulation to ignore the input signal such that control part 314 may not perform the operation based on the manipulation.

Figure 27:
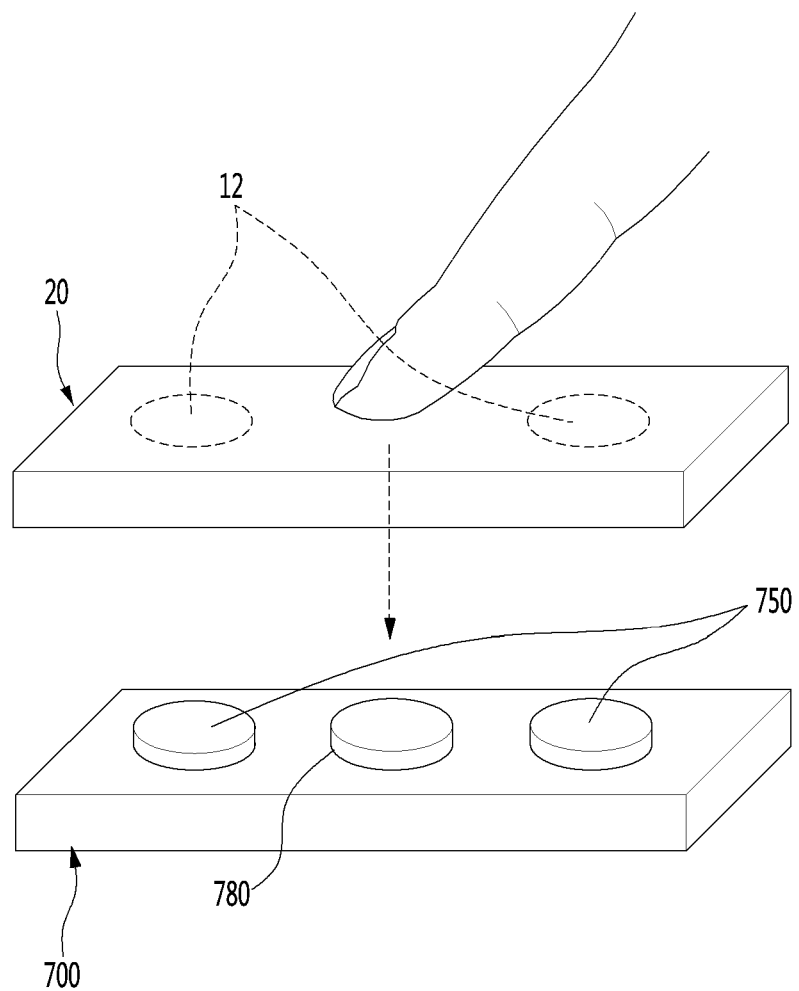
FIG. 27 is a schematic view illustrating a structure of a main component of a touch sensor assembly according to further another embodiment.
Figure 28:
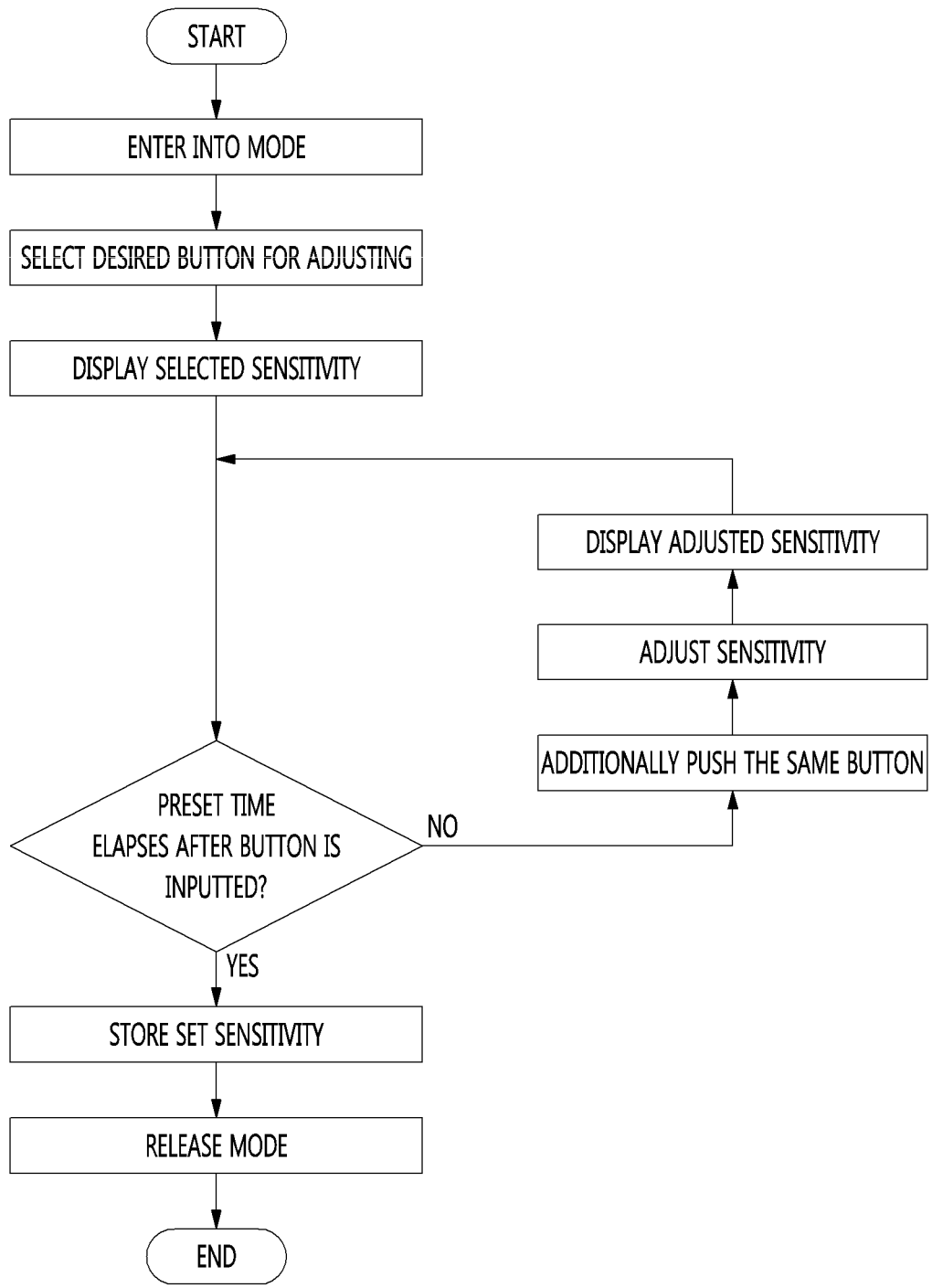
FIG. 28 is a flowchart illustrating a process of performing a sensitivity setting mode of the refrigerator according to an embodiment.

FIG. 27 is a schematic view illustrating a structure of a main component of a touch sensor assembly according to further another embodiment, where a dummy sensor 780 may be disposed between plurality of sensors 750. If the user pushes an area between the touch parts 12, the dummy sensor 780 may detect the user's manipulation. When a variation value in quantity of electricity, which occurs in the dummy sensor 780, is greater than those in quantity of electricity, which occurs in other sensors 750, the sensor control part 314 may determine that the user's touch manipulation is erroneous to ignore input signals of other sensors 750. If desired, the sensor control part 314 may display the erroneous manipulation through the display part 11 or output a sound of the erroneous manipulation using the acoustic output device 340. When an erroneous manipulation occurs, the sensor control part 314 may ignore the signal inputted and the user may be given an opportunity to provide a proper input.

An operation of the refrigerator will be described for entering one of a plurality of special modes. In addition to the manipulation for changing various general operational mode or state of the refrigerator, a manipulation or touch inputs may be provided for entering a plurality of special modes may be enabled. The special or configuration modes of the refrigerator may include a sensitivity setting mode for setting manipulation sensitivity of the touch part, an inspection mode for diagnosing an operation state of each component of the refrigerator, a test mode for checking a normal operation of an individual component of an ice maker, and a store display mode for displaying a product in a store to sell the product.

FIGS. 28-31 illustrate the sensitivity setting mode and sensitivity sitting operation of the refrigerator according to an embodiment. When power is applied to the refrigerator 1 to allow the refrigerator to operate, the user may push one of the plurality of touch parts 12 to manipulate an operation of the refrigerator 1. However, force pushed by the user into the touch part 12 may be different, or the preferred intensity in push manipulation may be different. The user may adjust and set a sensitivity of the sensor 750 through a combination of the manipulations of the plurality of touch parts 12 that are originally used for other purposes, such that the sensor 750 can effectively recognize the press of the touch part 12 by the user.

Figure 29:
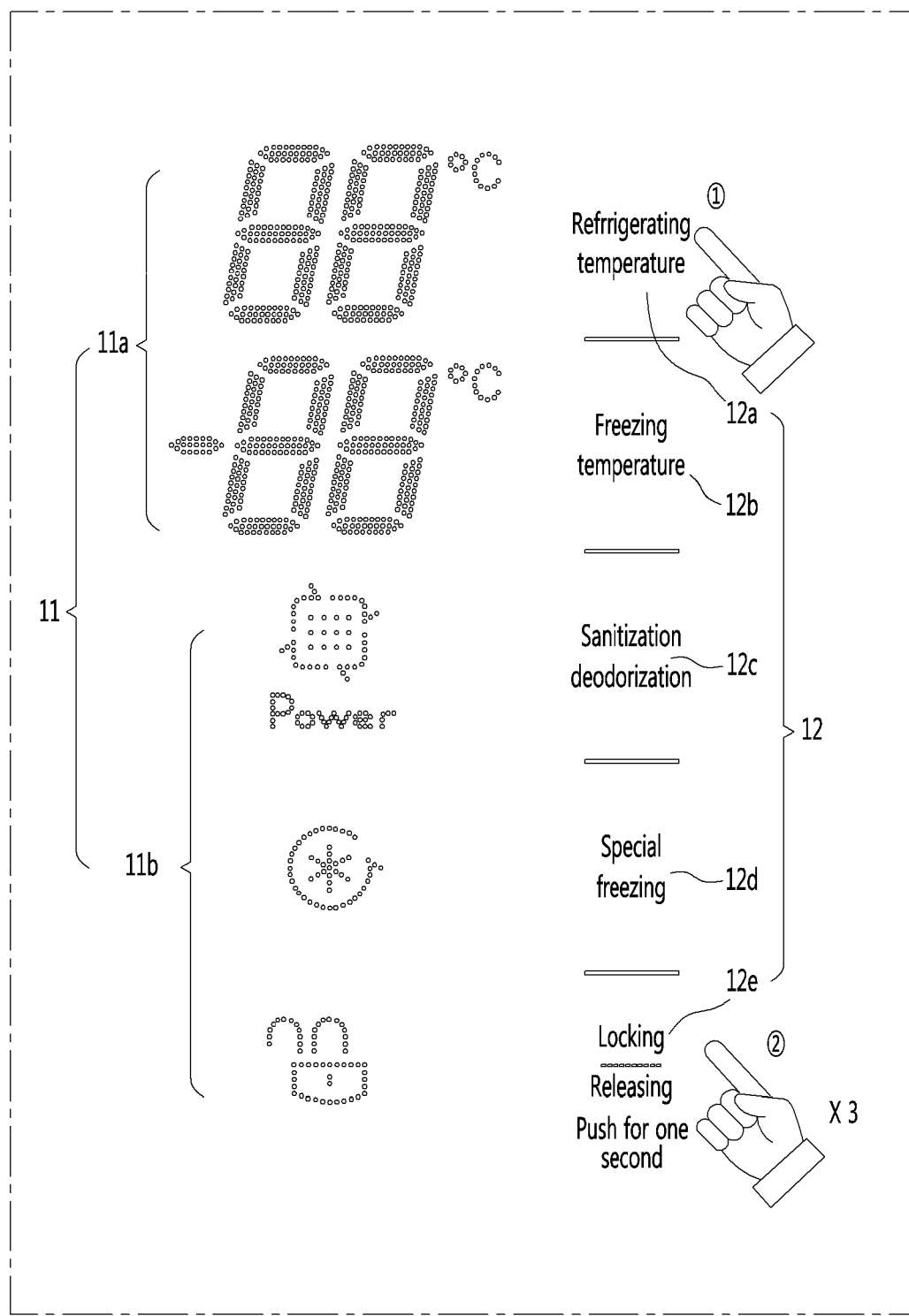
FIG. 29 is a view illustrating a manipulation method when entering into the sensitivity setting mode.

As illustrated in FIG. 29, the user may push a first touch part 12a, which is displayed as "a refrigerating temperature", of the plurality of touch parts 12. When a fifth touch part 12e, which is displayed as "locking release", is pushed three times before a preset time (for example, three seconds) elapses after the first touch part 12a is pushed, the refrigerator enters into the sensitivity setting mode. The manipulation of the fifth touch part 12e that is pushed three times in a row has to be performed within the preset time (for example, three seconds). The preset time is not limited to three seconds as suggested.

After entering the sensitivity setting mode, the display window 11 may be turned off. When the user pushes one of the plurality of touch parts 12a to 12e, that is desired for setting the sensitivity, the current sensitivity of the selected touch part may be displayed. The display window 11 may include two numerical display parts 11a, three symbol display parts 11b, and five touch parts 12a to 12e respectively corresponding to the five display parts 11a and 11b. The five touch parts 12a to 12e can be respectively formed at side positions of the five display parts 11a and 11b.

Figure 30:
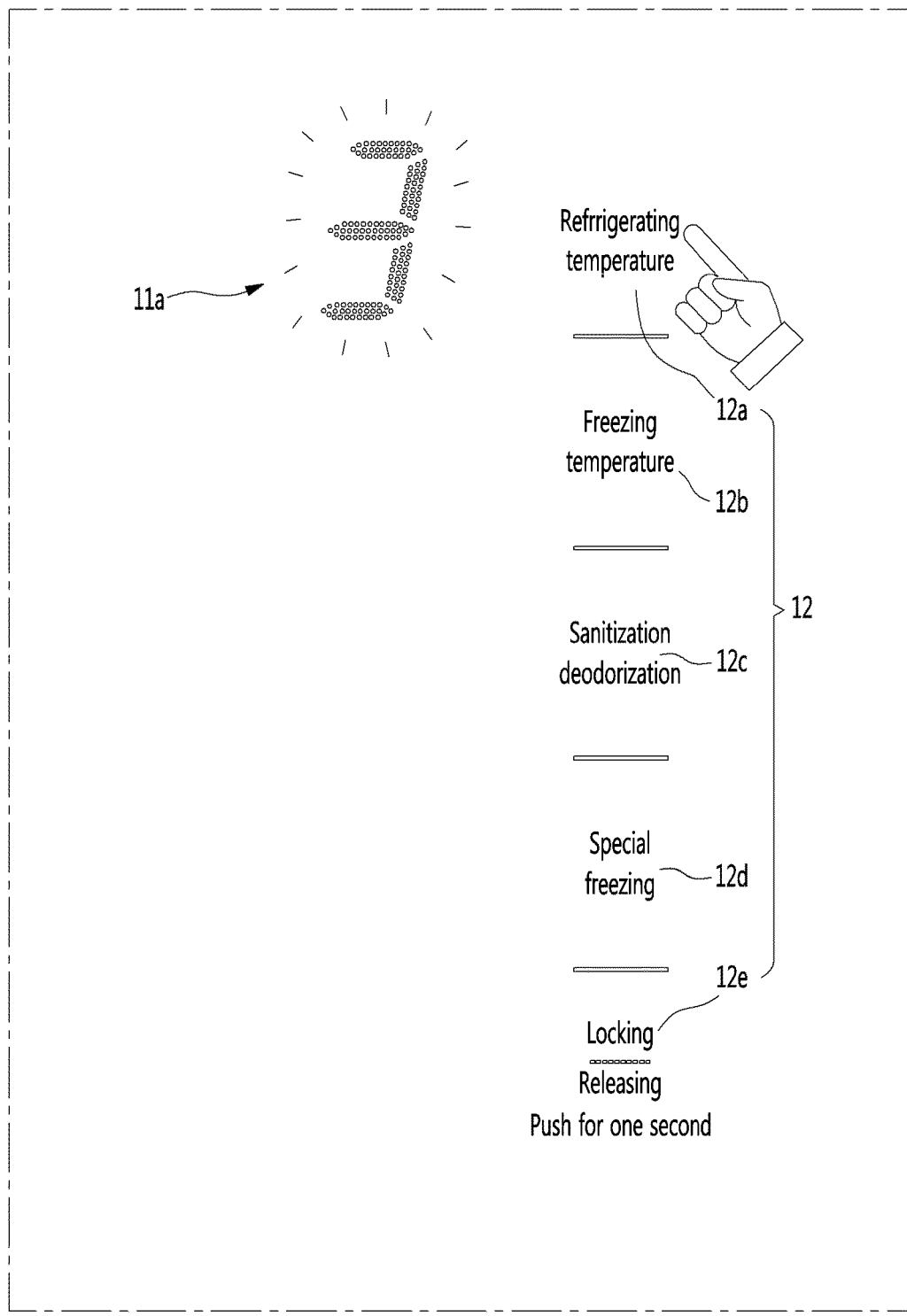
FIG. 30 is a view illustrating one state when the sensitivity is set in the sensitivity setting mode.

As illustrated in FIG. 30, after the refrigerator enters the sensitivity setting mode, the user may press the "refrigerating temperature" 12a (first touch part), and then the numerical display part 11a corresponding to the "refrigerating temperature" may flicker or blink to display the current sensitivity of the first touch part 12a in the form of a number, such as 3 shown in FIG. 30. The user may visually not only confirm the current sensitivity of the selected touch part, but also confirm what the currently selected touch part 12 to adjust the sensitivity is.

Figure 31:
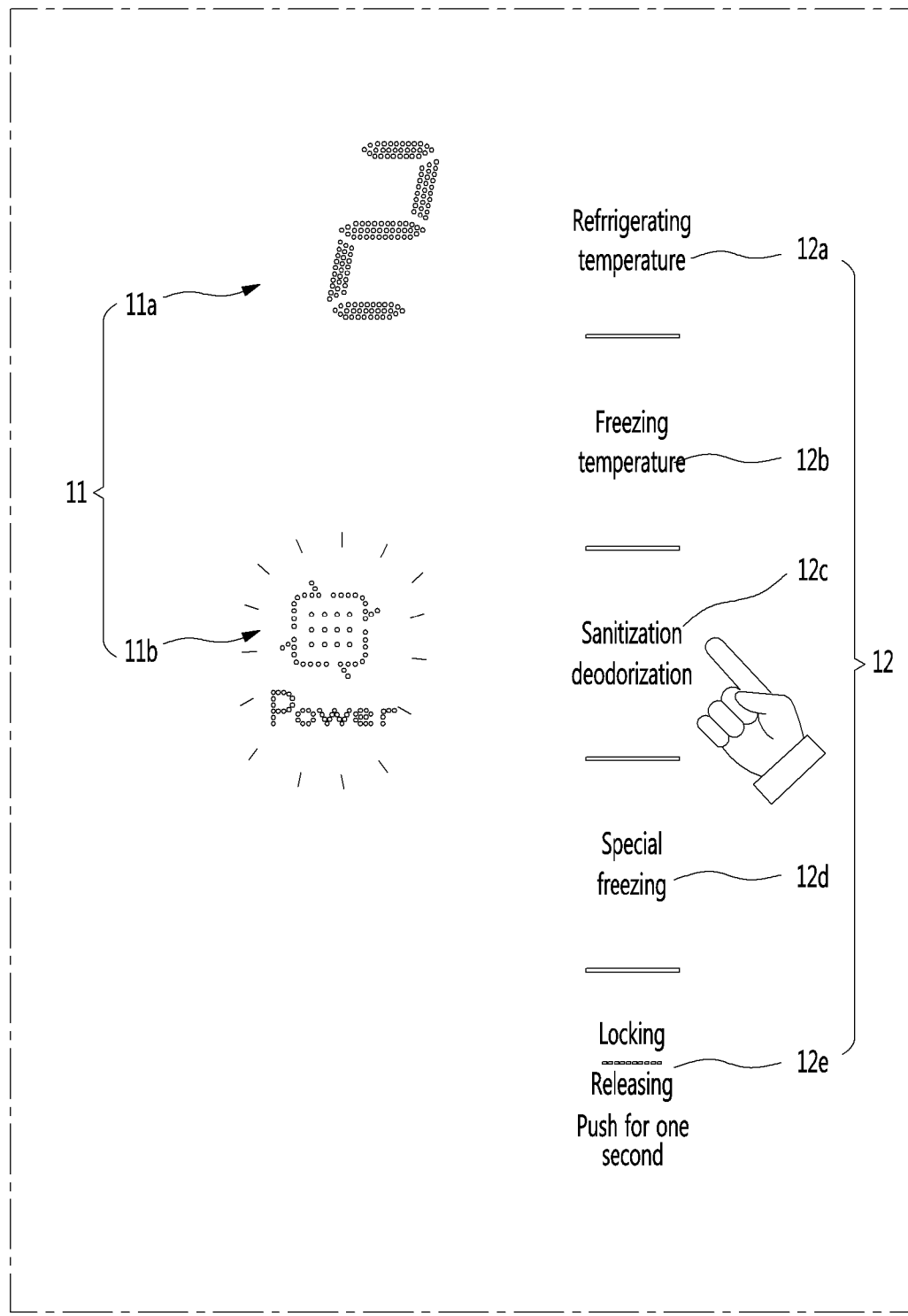
FIG. 31 is a view illustrating another state when the sensitivity is set in the sensitivity setting mode.

Alternatively, as illustrated in FIG. 31, after the refrigerator enters into the sensitivity setting mode, the user may press a third touch part 12c that is displayed as "sanitization deodorization", the symbol display part 11b that has a filter shape and is disposed on a side of the third touch part 12c may flicker or blink to show that the third touch part 12c is currently selected for adjustment of sensitivity and the current sensitivity of the third touch part 12c may be displayed on the numerical display part 11a in the form of the number.

As described above, in the state where the user has selected the desired touch part 12 for adjusting the sensitivity, and the current sensitively of the selected touch part is flickering on the numerical display part 11a, the user may repeatedly push the selected touch part 12 to adjust a sensitivity setting value of the selected touch part 12.

For example, as illustrated in FIG. 30, in the state where the current sensitivity setting value of the first touch part 12a is "3", if the first touch part 12a is pushed once more, the sensitivity setting value may further increase by one degree, and the number "4" may be displayed on the numerical display part 11a. Also, the number displayed on the numerical display part 11a increases according to the additionally pushed number of first touch part 12a, and thus, the sensitivity setting value of the first touch part 12a may further increase in degree.

The process for setting the sensitivity may be stored in the host control part 316. When the first touch part 12a is pushed once more in the uppermost sensitivity setting value, the sensitivity setting value may return to the lowermost sensitivity setting value, and then, the number "1" may be displayed on the numerical display part 11a. Here, the lowermost sensitivity setting value that is settable may be greater than a noise level of the sensor 750. Also, as the number is lower, the sensor 750 may sensitively recognize the manipulation of the touch part 12.

The above-described sensitivity setting manipulation has to be performed within a preset time, for example, within three seconds after the last touch part 12 is manipulated. It means that the interval between the previous press and the current press can be set to three seconds. If the preset time elapses, the last selected sensitivity setting value may be stored in the storage part 315, and the sensitivity setting mode may be ended. Also, when the sensitivity setting mode is ended, the display window 11 may return to the normal state in which the operation state of the refrigerator 1 is displayed. The three seconds interval corresponds to an interval between a previous pressing and the current pressing may be up to 3 seconds. For example, after pressing the third touch part 12c, the user may press the touch part 12a within 3 seconds to adjust the sensitivity, and the user may perform the second press within 3 seconds after performing the first pressing. If a user desires to set the sensitivity from 2 to 1 (2→3→4→1) in FIG. 31, the user may press the first touch part 12*a* within a total of 9 seconds as long as the user presses the touch part 12*a* within maximally 3 seconds interval. If 3 seconds have elapsed after second pressing, the sensitivity will be set to 4.

The first touch part 12*a* and the fifth touch part 12*e* which are manipulated to allow the refrigerator to enter into the sensitivity setting mode may be an example of the combination of the push manipulation for convenience of description. Alternatively, the combination of the manipulation of touch parts may be differently determined. The combined manipulation of the touch parts 12 may be used for the manipulation of the special mode except for the sensitivity setting mode according to the setting method. In other words, the above process may be used for other types of special mode setting rather than the sensitivity mode setting.

Figure 32:
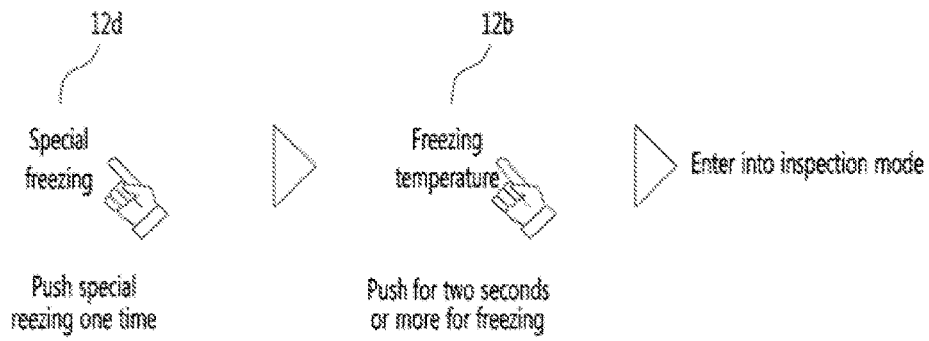
FIG. 32 is a view illustrating a process of entering into an inspection mode in the refrigerator according to an embodiment.

FIG. 32 is a view illustrating a process of entering into an inspection mode for the refrigerator according to an embodiment. To enter into the inspection mode during the normal operation of the refrigerator, the fourth touch part 12*d* that is displayed as "special freezing" is touched. Thereafter, the second touch part 12*b* that is displayed as a "freezing temperature" is pushed before the end of the preset time (for example, three seconds), such that the refrigerator may enter into the inspection mode. When, the second touch part 12*b* is pressed, the user may be required to press the touch part 12*b* for an extended time compared to a normal touch input in order to enter into the inspection mode. When the second touch part 12*b* is pushed for an extended time to enter into the inspection mode, the user may release the touch of the second touch part 12*b* to finish the entering manipulation.

The inspection mode may be performed after the refrigerator 1 is manufactured or before the refrigerator 1 is shipped. In the inspection mode, the overall setting of the refrigerator 1 may be confirmed or performed. The fourth touch part 12*d* and the second touch part 12*b* may be an example of the combination of the push manipulation for convenience of description. Alternatively, the combination of other touch parts 12 may be set according to the setting method.

Also, the combination of the manipulation of the touch part 12 explained in FIG. 32 may be used for entering into a different special mode, rather than the inspection mode.

Figure 33:
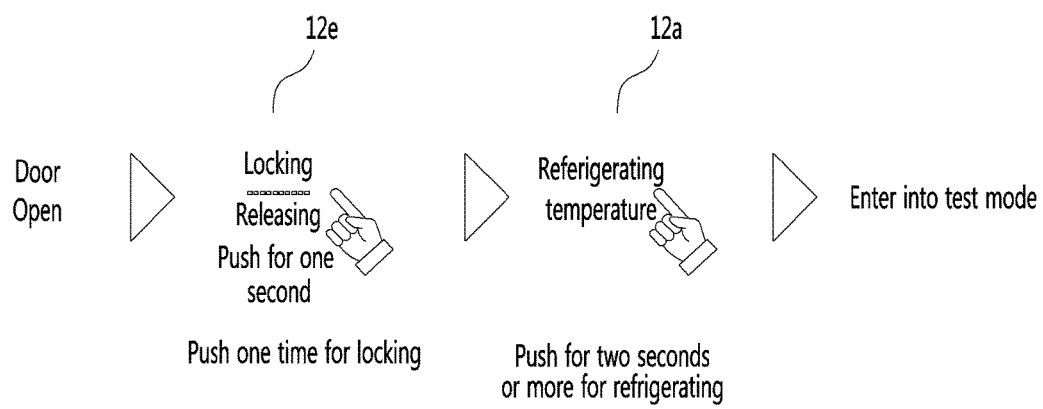
FIG. 33 is a view illustrating a process of entering into a test mode in the refrigerator according to an embodiment.

FIG. 33 is a view illustrating a process of entering into the test mode in the refrigerator according to an embodiment. To enter into the test mode during the normal operation of the refrigerator, the user touches a fifth touch part 12*e* that is displayed as "locking release" while the refrigerator door 10 is opened, and then the user pushes the first touch part 12*a* that is displayed as the "refrigerating temperature" before the preset time (for example, three seconds) elapses, the refrigerator may enter into the test mode. Further, the first touch part 12*a* may be pressed for an extended time compared to a normal touch input. When the first touch part 12*a* is pushed for the extended time to enter into the test mode, the user may release the touch of the first touch part 12*a* to finish the entering manipulation.

In the test mode, when an error occurs during the use of the refrigerator 1, the test mode may be initiated by the user or a service worker to test whether devices of the refrigerator 1 such as an ice maker and dispenser are operating normally. The fifth touch part 12*e* and the first touch part 12*a* which are manipulated to allow the refrigerator to enter into the test mode may be an example of the combination of the push manipulation for convenience of description. Alternatively, the combination of other touch parts 12 may be set according to the setting method.

Also, the combination of the manipulation of the touch part 12 explained in FIG. 33 may be used for entering into a different special mode, rather than the test.

Figure 34:
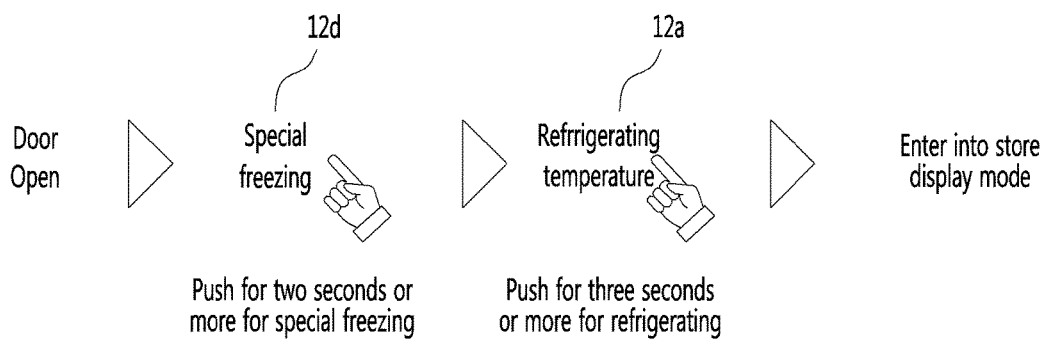
FIG. 34 is a view illustrating a process of entering into a store display mode in the refrigerator according to an embodiment.

FIG. 34 is a view illustrating a process of entering into a store display mode in the refrigerator according to an embodiment. To enter into the store display mode during the operation of the refrigerator, the user firstly touches the fourth touch part 12*d* that is displayed as the "special freezing" while the refrigerator door 10 is opened, secondly pushes the first touch part 12*a* that is displayed as the "refrigerating temperature" before the preset time (for example, second seconds) elapses, and then the refrigerator may enter into the store display mode. Further, the first touch part 12*a* may be pressed for an extended time compared to a normal touch input. After the first touch part 12*a* is pushed for the extended time to enter into the store display mode, the user may release the push of the first touch part 12*a* to finish the entering manipulation.

In the store display mode, an operation state or set state of the refrigerator may change so that the refrigerator is adequate for a display model for operating the refrigerator at a retail store. For example, it may be unnecessary to maintain a temperature within the refrigerator in the store display mode. For example, a defrosting operation may not be required, and operations of a compressor and heater may be maintained in an off state.

The fourth touch part 12*d* and the first touch part 12*a* which are manipulated to allow the refrigerator to enter into the store display mode may be an example of the combination of the push manipulation for convenience of description. Alternatively, the combination of other touch parts 12 may be set according to the setting method. Also, the combination of the manipulation of the touch part 12 explain in FIG. 34 may be used for entering into a different special mode, rather than the store display mode.

As described above, the refrigerator according to the embodiments may enter into the various special modes through various methods. The refrigerator according to the embodiments may enter into other special modes in addition to the above-described modes, and manipulation of other touch parts 12 in addition to the above-described touch part 12 may combined with each other.

According to an embodiment, the refrigerator may enter into the special mode for the service or inspection when the user successively manipulates the specific touch parts in a fixed order to prevent the malfunction due to the user's carelessness from occurring.

According to an embodiment, the plurality of touch parts may be not recognized at the same time to prevent the plurality of touch parts from being selected by the touch mistake due to the characteristics of the touch sensor or to prevent the refrigerator from being malfunctioned or entering into an undesired special mode due to the impact when the door is opened.

The sensitivity occurring when the user touches the touch part may be intuitionally set by pushing the corresponding touch part. The change in sensitivity may be expressed through the display to allow the user to more accurately and easily adjust the touch sensitivity.

The touch part may be adjusted to touch sensitivity that is desired by the user to prevent the recognition error in touch manipulation or the damage due to the excessive push from occurring. Since the user sets the optimum sensitivity that is desired by the individual user, the convenience in use of the user may be improved.

Since each of the plurality of touch parts is set to the desired sensitivity, diverse sets may be enable according to the user's preference or user pattern.

Embodiments provide a refrigerator in which a plurality of touch parts are successively manipulated to enter into a special mode, thereby preventing the refrigerator from being malfunctioned and a method for controlling the same.

Embodiments also provide a refrigerator of which touch sensitivity is visualized and a method for controlling the same.

In an embodiment, a refrigerator may include: a door of which at least a portion of an outer appearance is defined by a front panel having a plate shape and in which a window through which light for displaying information is transmitted is disposed in the front panel; a display assembly mounted inside the door to correspond to the window; a touch sensor assembly closely attached to a rear surface of the front panel, the touch sensor assembly including a plurality of sensors for detecting user's manipulation on the front panel; and a sensor control part connected to the touch sensor assembly to process manipulation detection signals of the sensors, wherein the sensor control part determines the user's manipulation as erroneous manipulation when the manipulation detection signals of the plurality of sensors occur at the same time to ignore the manipulation detection signals of the sensors.

The sensor control part may ignore the manipulation detection signals of the sensors when variation values in quantity of electricity, which are inputted from the plurality of sensors, exceed a preset reference value at the same time.

When the sensor control part determines the user's manipulation as erroneous manipulation, the erroneous manipulation may be informed to the user by using a display part or acoustic output device that is disposed on the door.

The sensor control part may be disposed on the display assembly, and the sensor control part may be connected to the display assembly by a sensor PCB, which constitutes the touch sensor assembly and on which the sensors are mounted, and cable connector.

The sensor control part may successively manipulate the plurality of sensors to allow the refrigerator to enter into a special mode in which an operation of the refrigerator is settable.

The sensor control part may be capable of adjusting a sensitivity setting value of each of the sensors by entering into the special mode.

The sensor control part may output a variation in set sensitivity setting value of the sensor through the display assembly.

The sensor control part may display a state of the refrigerator entering into the special mode through the display assembly when entering into the special mode.

The front panel may includes: a display part in which a plurality of holes are combined in a state in which information is displayable and through which light irradiated from the display assembly is transmitted; and a touch part disposed at a position corresponding to the sensor to guide a touch manipulation area to the user.

The display part may include a numerical display part for displaying information in the form of seven segments, and the display part may display the sensitivity setting value of the sensor in the form of a figure in the special mode.

The display part may be divided into a plurality of areas corresponding to the plurality of sensors on sides of the plurality of sensors, and the display part disposed on the area corresponding to the sensor selected in the special mode may be turned on or off to visualize the position of the manipulated sensor.

The special mode may include at least one of: a sensitivity setting mode for setting sensitivity of the sensor; an inspection mode for inspecting and setting a state of the refrigerator that is manufactured in a manufacturing line; a test mode for testing a normal operation of one of components to which power is supplied in the refrigerator, and a store display mode for converting the state of the refrigerator into a state in which the refrigerator is displayed in a store.

The refrigerator may further include a storage part connected to the sensor control part, the storage part storing the sensitivity setting value of the sensor, which is set in the special mode, to compare the sensitivity setting value to a value inputted when the sensor manipulated in a normal mode.

The storage part may include an EEPROM.

The refrigerator may further include a host control part connected to the sensor control part and the storage part, wherein the host control part may receive a signal, which is inputted from the sensor control part, with respect to whether the manipulation of the sensor is recognized to process the signal in the normal mode, and the host control part may adjust the sensitivity setting value of the sensor according to the manipulation of the sensor to store the adjusted sensitivity setting value in the storage part in the special mode.

In another embodiment, a method for controlling a refrigerator including a door of which at least a portion of an outer appearance is defined by a front panel on which a plurality of touch parts for manipulation input are formed and in which a window through which light for displaying information is transmitted is disposed, a display assembly mounted inside the door to correspond to the window, a touch sensor assembly closely attached to a rear surface of the front panel, the touch sensor assembly including a plurality of sensors for detecting user's manipulation on the front panel, and a sensor control part connected to the touch sensor assembly to process manipulation detection signals of the sensors, wherein the sensor control part determines the user's manipulation as erroneous manipulation when the manipulation detection signals of the plurality of sensors occur at the same time to ignore the manipulation detection signals of the sensors, and after first manipulation in which one of the plurality of touch parts is manipulated, second manipulation in which one of the plurality of touch parts is again manipulated within a preset time is performed to enter into a special mode for confirming an operation state of the refrigerator and changing set-up of the refrigerator.

The touch part manipulated when the first manipulation is performed and the touch part manipulated when the second manipulation is performed may be different from each other.

After the last touch part is manipulated after entering into the special mode, when one of the plurality of touch parts is not manipulated within a preset time, the special mode may be finished to return to a normal mode.

In the first manipulation, the touch part may be touched one time, and in the second manipulation, the other touch part may be continuously touched by the preset number.

The second manipulation may be completed within the preset time.

In the first manipulation, the touch part may be touched, and in the second manipulation, the other touch part may be maintained in the pushed state for a preset time or more.

In the first manipulation, the touch part may be maintained in the pushed state for a preset time or more, and in the second manipulation, the other touch part may be maintained in the pushed state for a different preset time or more.

The first manipulation may be performed in a state where a signal for opening the refrigerator door is inputted.

The special mode may include at least one of: a sensitivity setting mode for setting sensitivity of the sensor; an inspection mode for inspecting and setting a state of the refrigerator that is manufactured in a manufacturing line; a test mode for testing a normal operation of one of components to which power is supplied in the refrigerator, and a store display mode for converting the state of the refrigerator into a state in which the refrigerator is displayed in a store.

In further another embodiment, a method for controlling a refrigerator including a door of which at least a portion of an outer appearance is defined by a front panel on which a plurality of touch parts for manipulation input are formed and in which a window through which light for displaying information is transmitted is disposed, a display assembly mounted inside the door to correspond to the window, a touch sensor assembly closely attached to a rear surface of the front panel, the touch sensor assembly including a plurality of sensors for detecting user's manipulation on the front panel, and a sensor control part connected to the touch sensor assembly to process manipulation detection signals of the sensors includes: determining the user's manipulation as erroneous manipulation when the manipulation detection signals are generated from the plurality of sensors at the same time to ignore the manipulation detection signals of the sensors and successively manipulating the touch parts to enter into a special mode; selecting one of the plurality of touch parts to select the sensor for setting sensitivity; continuously manipulating the selected touch part to manipulate an increase or decrease of the sensitivity setting value of the selected sensor; and releasing the special mode after the increasing or decreasing sensitivity setting value of the sensor is stored in a storage part to enter into a normal mode.

In the selecting of the sensor, the lateral display part corresponding to the selected sensor may be turned on or off to visualize the sensor.

In the manipulating of the increase or decrease of the sensitivity setting value, when a signal with respect to the manipulation of the selected sensor is inputted, the sensor control part may detect the signal and transmit the detected signal into a host control unit, and the host control part may increase or decrease the sensitivity setting value, which is transmitted from the sensor control part, in proportional to the manipulated number of sensor to transmit the increasing or decreasing sensitivity setting value into the storage part.

In the manipulating of the increase or decrease of the sensitivity setting value, the sensitivity setting value that increases or decreases according to the manipulation of the sensor may be displayed through a display part disposed on the refrigerator door.

The display part may be constituted by seven segments for displaying an inner temperature of the refrigerator to display the sensitivity setting value by stages by using figures.

The storage part may include a nonvolatile memory.

After the special mode returns to the normal mode, when the touch part is manipulated, the sensor control part may compare a quantity of electricity, which is inputted from the sensor, to the sensitivity setting value stored in the storage part, and when the quantity of electricity is greater than the sensitivity setting value, the manipulation of the touch part may be recognized, and when the quantity of electricity is less than the sensitivity setting value, the manipulation of the touch part may not be recognized.

Although a side by side type refrigerator is exemplified for convenience in the embodiments, the present disclosure may be applied to all types of refrigerator as well as home appliance including a touch sensor assembly.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A refrigerator comprising:
a door having a front panel that allows light to pass through to display information;
a touch sensor assembly provided at a rear surface of the front panel, the touch sensor assembly including:
a sensor printed circuit board; and
a plurality of sensors mounted on the sensor printed circuit board to detect a touch input on the front panel; and
a display assembly mounted inside the door at a position spaced apart from the touch sensor assembly, and configured to emit light to display the information, the display assembly including:
a display printed circuit board on which at least one LED is mounted; and
a sensor controller to process signals transmitted from the plurality of sensors,
wherein the sensor controller is electrically connected to the sensor printed circuit board by a cable connector to receive the signals transmitted from the plurality of sensors,
wherein the sensor controller determines the touch input as an erroneous input when the signals generated by at least two sensors occur at the same time, wherein the front panel includes:
a display area in which a plurality of holes are arranged in a prescribed configuration to display light irradiation from the display assembly; and
a touch area provided at a position corresponding to the plurality of sensors and having a plurality of touch parts to which the touch input is applied, wherein when a first touch part corresponding to a first sensor is touched, and a second touch part corresponding to a second sensor is touched within a first predetermined time after the first touch part is touched and the second touch part is held in a pressed state for a set time, the sensor controller allows the refrigerator to enter into a special mode to set or adjust an operation condition of the refrigerator.

2. The refrigerator according to claim 1, wherein the sensor controller ignores the signals of the at least two sensors when variation values in quantity of electricity exceed a preset reference value.

3. The refrigerator according to claim 1, wherein through the display assembly, the sensor controller displays a state of the refrigerator entering into the special mode.

4. The refrigerator according to claim 1, wherein the display area includes a numerical display area for displaying numerical information based on irradiation of seven light source segments, and the display area displays the sensitivity setting value of one of the plurality of sensors in the form of a number during in the special mode.

5. The refrigerator according to claim 1, wherein the display area is divided into a plurality of display parts corresponding to the plurality of touch parts, the plurality of display parts being located adjacent to the plurality of touch parts, wherein the display area corresponding to one of the plurality of sensors selected for setting sensitivity is configured to flicker.

6. The refrigerator according to claim 1, wherein the special mode includes at least one of:
a sensitivity setting mode for setting sensitivity of the plurality of sensors;
an inspection mode for inspecting and setting a state of the refrigerator that is manufactured in a manufacturing line;
a test mode for testing a normal operation of at least one component to which power is supplied in the refrigerator, and
a store display mode for turning off non-essential components for display of the refrigerator at a retail store.

7. The refrigerator according to claim 1, wherein the sensor controller allows adjustment of a sensitivity setting value of each of the sensors by entering into the special mode.

8. The refrigerator according to claim 7, wherein the sensor controller outputs a variation in set sensitivity setting value of the sensors through the display assembly.

9. The refrigerator according to claim 7, further comprising a storage medium connected to the sensor controller, the storage medium storing the sensitivity setting value of the plurality of sensors settable in the special mode for comparing the sensitivity setting value to a value received based on the touch input in a normal mode of the refrigerator.

10. The refrigerator according to claim 9, wherein the storage medium is an EEPROM.

11. The refrigerator according to claim 9, further comprising a host controller connected to the sensor controller and the storage medium,
wherein when the host control part receives a signal, from the sensor controller, the host controller determines whether the touch input is recognized to process the signal in the normal mode, and
during the special mode, the host controller adjusts the sensitivity setting value of the plurality of sensors according to the touch input to store the adjusted sensitivity setting value in the storage medium.

* * * * *